(12) United States Patent
Kakehata

(10) Patent No.: US 7,781,306 B2
(45) Date of Patent: Aug. 24, 2010

(54) SEMICONDUCTOR SUBSTRATE AND METHOD FOR MANUFACTURING THE SAME

(75) Inventor: Tetsuya Kakehata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 115 days.

(21) Appl. No.: 12/155,338

(22) Filed: Jun. 3, 2008

(65) Prior Publication Data

US 2008/0315351 A1    Dec. 25, 2008

(30) Foreign Application Priority Data

Jun. 20, 2007   (JP) .............................. 2007-162106

(51) Int. Cl.
*H01L 21/30* (2006.01)

(52) U.S. Cl. .............................. 438/455; 257/E21.088

(58) Field of Classification Search ......... 438/455–459; 257/E21.088
See application file for complete search history.

(56) References Cited

U.S. PATENT DOCUMENTS

| | | | |
|---|---|---|---|
| 5,374,564 A | 12/1994 | Bruel | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 7,176,525 B2 | 2/2007 | Fukunaga | |
| 7,199,024 B2 | 4/2007 | Yamazaki | |
| 7,256,776 B2 | 8/2007 | Yamazaki et al. | |

(Continued)

FOREIGN PATENT DOCUMENTS

JP    11-163363    6/1999

(Continued)

OTHER PUBLICATIONS

Jeng et al., Anomalous Diffusion of Fluorine in Silicon, Appl. Phys. Lett. (Applied Physics Letters), Sep. 14, 1992, pp. 1310-1312, vol. 61, No. 11.

*Primary Examiner*—Davienne Monbleau
*Assistant Examiner*—Matthew Reames
(74) *Attorney, Agent, or Firm*—Eric J. Robinson; Robinson Intellectual Property Law Office, P.C.

(57) ABSTRACT

A semiconductor device and a method for manufacturing thereof are provided. The method includes a step of forming a first insulating film containing silicon and oxygen as its composition over a single-crystal semiconductor substrate, a step of forming a second insulating film containing silicon and nitrogen as its composition over the first insulating film, a step of irradiating the second insulating film with first ions to form a separation layer in the single-crystal semiconductor substrate, a step of irradiating the second insulating film with second ions so that halogen is contained in the first insulating film, and a step of performing heat treatment to separate the single-crystal semiconductor substrate with a single-crystal semiconductor film left over the supporting substrate.

18 Claims, 18 Drawing Sheets

U.S. PATENT DOCUMENTS

| | | |
|---|---|---|
| 2004/0104424 A1 | 6/2004 | Yamazaki |
| 2005/0009252 A1 | 1/2005 | Yamazaki et al. |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0291022 A1 | 12/2007 | Yamazaki et al. |

FOREIGN PATENT DOCUMENTS

| | | |
|---|---|---|
| JP | 2000-124092 | 4/2000 |

SEMICONDUCTOR SUBSTRATE AND METHOD FOR MANUFACTURING THE SAME

BACKGROUND OF THE INVENTION

1. Field of the Invention

The present invention relates to a semiconductor device manufacturing substrate which has an SOI (silicon on insulator) structure, and a method for manufacturing the semiconductor device manufacturing substrate.

Note that a semiconductor device in this specification refers to all types of devices which can function by utilizing semiconductor characteristics, and electro-optic devices, semiconductor circuits, and electronic devices are all included in the category of the semiconductor device.

2. Description of the Related Art

With development of VLSI technology, lower power consumption and higher speed over the scaling law which can be realized by bulk single-crystal silicon have been demanded. In order to meet these demands, an SOI structure has been attracting attention. This technology allows an active region (channel formation region) of a field effect transistor (FET), which has been formed of bulk single-crystal silicon, to be formed of a single-crystal silicon thin film. It is known that a field effect transistor manufactured using an SOI structure has lower parasitic capacitance than a field effect transistor manufactured using a bulk single-crystal silicon substrate, which is an advantage in increasing speed.

A SIMOX substrate or a bonded substrate is known as an SOI substrate. An SOI structure of a SIMOX substrate is obtained in such a manner that oxygen ions are implanted into a single-crystal silicon substrate and heat treatment is performed at greater than or equal to 1300° C. to form a buried oxide film, and accordingly a single-crystal silicon film is formed on the surface. As for a SIMOX substrate, oxygen ion implantation can be controlled precisely, and thus a single-crystal silicon film with a uniform thickness can be formed; however, there are time and cost problems because a long period of time is needed for oxygen ion implantation. In addition, there is another problem in that a single-crystal silicon substrate is likely to be damaged during oxygen ion implantation, which has an influence on a single-crystal silicon film to be obtained.

An SOI structure of a bonded substrate is obtained in such a manner that two single-crystal silicon substrates are bonded to each other with an insulating film interposed therebetween and one of the two single-crystal silicon substrates is thinned to form a single-crystal silicon film. As a thinning method, a hydrogen ion implantation separation method is known. A hydrogen ion implantation separation method is a method in which hydrogen ions are implanted into one single-crystal silicon substrate to form a microbubble layer at a predetermined depth from the silicon substrate surface, a thin single-crystal silicon film can be bonded to the other single-crystal silicon substrate with use of the microbubble layer as a cleavage layer (see Patent Document 1: Japanese Published Patent Application No. 2000-124092).

In recent years, there has been an attempt to form a single-crystal silicon film over a substrate with an insulating surface, such as a glass substrate. For example, an SOI substrate in which a single-crystal silicon film is formed over a glass substrate disclosed by the present applicant is known as an example (see Patent Document 2: Japanese Published Patent Application No. H11-163363).

SUMMARY OF THE INVENTION

When an SOI structure is formed by a hydrogen ion implantation separation method, structural defects such as dangling bonds occur more easily in a semiconductor film to be obtained because ions are directly implanted into a semiconductor substrate which serves as a base of the semiconductor film. Dangling bonds might become a factor of a localized level in the semiconductor film and deteriorate electric characteristics of a semiconductor device.

In view of the above-described problems, it is an object of the present invention to provide a semiconductor device manufacturing substrate which enables manufacture of a semiconductor device, electric characteristics of which are improved, and a method for manufacturing the semiconductor device manufacturing substrate. It is another object to provide a highly-reliable semiconductor device.

A semiconductor device manufacturing substrate is manufactured by transfer of a semiconductor film separated from a semiconductor substrate to a supporting substrate with an insulating surface. An insulating film containing silicon and oxygen as its composition and an insulating film containing silicon and nitrogen as its composition are formed in order over the semiconductor substrate which serves as a base of the semiconductor film, and then ions are implanted into the semiconductor substrate, whereby a separation layer is formed in a region at a predetermined depth. Next, halogen ions are implanted into the insulating film containing silicon and oxygen as its composition formed over the semiconductor substrate to form an insulating film containing silicon and oxygen as its composition in which halogen is contained, and then a bonding layer is formed over the insulating film containing silicon and nitrogen as its composition. The semiconductor substrate and the supporting substrate are superimposed on each other and bonded to each other with the insulating film containing silicon and oxygen as its composition, the insulating film containing silicon and nitrogen as its composition, and the bonding layer from the semiconductor substrate side interposed therebetween. Part of the semiconductor substrate is separated at the separation layer by heat treatment and the semiconductor film is made to remain over the supporting substrate. Accordingly, a semiconductor device manufacturing substrate is manufactured.

Note that "to implant ions" in this specification refers to irradiation of a semiconductor substrate with ions which are accelerated by an electric field, so that an element of the ions used for the irradiation is introduced into the semiconductor substrate. A "separation layer" in this specification is a region which is embrittled so as to have microvoids by irradiation of a semiconductor substrate with ions. Separation at a separation layer by later heat treatment enables a semiconductor layer to be formed over a supporting substrate. A "bonding layer" in this specification refers to a film (an insulating film as a typical example) which is formed on a bonding surface which forms a bond with a supporting substrate (or an insulating film formed over a supporting substrate).

One aspect of the present invention is a method for manufacturing a semiconductor device manufacturing substrate, which includes the steps of forming an insulating film containing silicon and oxygen as its composition and an insulating film containing silicon and nitrogen as its composition in order over one surface of a single-crystal semiconductor substrate; forming a separation layer in a region at a predetermined depth in the single-crystal semiconductor substrate by irradiation of the single-crystal semiconductor substrate with ions; irradiating the insulating film containing silicon and oxygen as its composition with halogen ions, so that halogen is contained in the insulating film containing silicon and oxygen as its composition; and forming a bonding layer over the insulating film containing silicon and nitrogen as its composition, where the single-crystal semiconductor substrate and a supporting substrate are superimposed on each other and bonded to each other with the insulating film containing silicon and oxygen as its composition, the insulating film containing silicon and nitrogen as its composition, and the bonding layer which are stacked in order from the single-crystal semiconductor substrate side interposed therebetween, and part of the single-crystal semiconductor substrate is separated at the separation layer by heat treatment at greater than or equal to 550° C. to form a single-crystal semiconductor film over the supporting substrate.

Another aspect of the present invention is a method for manufacturing a semiconductor device manufacturing substrate, which includes the steps of forming an insulating film containing silicon and oxygen as its composition and an insulating film containing silicon and nitrogen as its composition in order over one surface of a single-crystal semiconductor substrate; forming a separation layer in a region at a predetermined depth in the single-crystal semiconductor substrate by irradiation of the single-crystal semiconductor substrate with ions; irradiating the insulating film containing silicon and oxygen as its composition with halogen ions, so that halogen is contained in the insulating film containing silicon and oxygen as its composition; and forming a bonding layer over the insulating film containing silicon and nitrogen as its composition, where the single-crystal semiconductor substrate and a supporting substrate are superimposed on each other and bonded to each other with the insulating film containing silicon and oxygen as its composition, the insulating film containing silicon and nitrogen as its composition, and the bonding layer which are stacked in order from the single-crystal semiconductor substrate side interposed therebetween, and part of the single-crystal semiconductor substrate is separated at the separation layer by heat treatment at greater than or equal to 550° C. to form a single-crystal semiconductor film over the supporting substrate and to distribute halogen in the single-crystal semiconductor film.

In the above-described structure, fluorine or chlorine is desirably used as halogen.

In the above-described structure, a silicon oxide film or a silicon oxynitride film is desirably formed as the insulating film containing silicon and oxygen as its composition. A silicon nitride film or a silicon nitride oxide film is desirably formed as the insulating film containing silicon and nitrogen as its composition.

A silicon oxide film or a film which has siloxane bonds is desirably formed as the bonding layer. The silicon oxide film which forms the bonding layer is desirably formed by a chemical vapor deposition method with use of organic silane or inorganic silane as a source gas.

In the above-described structure, a glass substrate, a quartz substrate, a ceramic substrate, a sapphire substrate, or a metal substrate whose surface is coated with an insulating film can be used as the supporting substrate.

Another aspect of the present invention is a semiconductor device manufacturing substrate including a single-crystal semiconductor film containing halogen which is bonded to a supporting substrate; and between the supporting substrate and the single-crystal semiconductor film, an insulating film containing silicon and oxygen as its composition which is in contact with the single-crystal semiconductor film and contains the same halogen as the single-crystal semiconductor film, an insulating film containing silicon and nitrogen as its composition which is in contact with the insulating film containing silicon and oxygen as its composition, and a bonding layer which is in contact with the insulating film containing silicon and nitrogen as its composition.

In the above-described structure, halogen contained in the single-crystal semiconductor film and the insulating film containing silicon and oxygen as its composition film is desirably fluorine or chlorine.

In the above-described structure, the insulating film containing silicon and oxygen as its composition is desirably a silicon oxide film or a silicon oxynitride film. The insulating film containing silicon and nitrogen as its composition is desirably a silicon nitride film or a silicon nitride oxide film. The bonding layer is desirably a silicon oxide film or a film which has siloxane bonds.

In the above-described structure, a glass substrate, a quartz substrate, a ceramic substrate, a sapphire substrate, or a metal substrate whose surface is coated with an insulating film can be used as the supporting substrate.

Application of the semiconductor device manufacturing substrate of the present invention makes it possible to manufacture a semiconductor device which has good electric characteristics. In addition, manufacture of a semiconductor device reliability of which is improved can be realized.

DETAILED DESCRIPTION OF THE INVENTION

Figure 1:
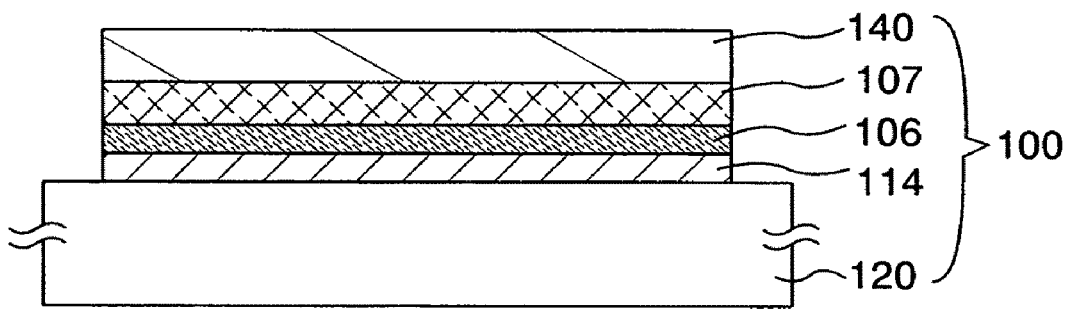
FIG. 1 is a view illustrating a structural example of a semiconductor device manufacturing substrate.

Embodiment Modes of the present invention will be hereinafter described with reference to the accompanying drawings. Note that the present invention is not limited to the description below and it is easily understood by those skilled in the art that modes and details of the present invention can be modified in various ways without departing from the purpose and scope of the present invention. Therefore, the present invention should not be interpreted as being limited to the description below of Embodiment Modes. Note that, in the structures of the present invention described below, reference numerals denoting the same portions may be used in common in different drawings.

Embodiment Mode 1

A semiconductor device manufacturing substrate of this embodiment mode has an SOI structure and is formed by transfer of a semiconductor film separated from a semiconductor substrate to a supporting substrate. As the supporting substrate, a substrate which is different from a substrate used as the semiconductor substrate is used. One mode of the semiconductor device manufacturing substrate of this embodiment mode is shown in FIG. 1.

As for a semiconductor device manufacturing substrate 100 shown in FIG. 1, a semiconductor film 140 is provided over a supporting substrate 120. An insulating film 107 containing silicon and oxygen as its composition which is in contact with the semiconductor film 140, an insulating film 106 containing silicon and nitrogen as its composition which is in contact with the insulating film 107 containing silicon and oxygen as its composition, and a bonding layer 114 which is in contact with the insulating film 106 containing silicon and nitrogen as its composition are provided between the supporting substrate 120 and the semiconductor film 140. That is, the semiconductor device manufacturing substrate 100 has a structure in which the semiconductor film 140 is bonded to the supporting substrate with a stacked film of the bonding layer 114, the insulating film 106 containing silicon and nitrogen as its composition, and the insulating film 107 containing silicon and oxygen as its composition in order over the supporting substrate 120 interposed therebetween.

As the semiconductor film 140, a single-crystal semiconductor or a polycrystalline semiconductor can be used, and single-crystal silicon is desirably used. In addition, a semiconductor which is capable of being separated from a semiconductor substrate by ion implantation separation method can be used as well. For example, silicon, germanium, or a compound semiconductor such as silicon germanium, gallium arsenide, or indium phosphide can be used. The semiconductor film 140 can be formed to a thickness of greater than or equal to 5 nm and less than or equal to 500 nm, preferably greater than or equal to 10 nm and less than or equal to 200 nm.

Note that the semiconductor film 140 in this embodiment mode contains halogen. Halogen is desirably contained in the semiconductor film 140 at a peak concentration of the range of $1 \times 10^{17}$ atoms/cm$^3$ to $1 \times 10^{21}$ atoms/cm$^3$.

A substrate with an insulating surface or a substrate with an insulating property is used as the supporting substrate 120. Specifically, a substrate which is different from a substrate used as the semiconductor substrate is used, and the following are given: various glass substrates (also referred to as a non-alkali glass substrate) used in the electronics industry, such as an aluminosilicate glass substrate, an aluminoborosilicate glass substrate, or a barium borosilicate glass substrate; a quartz substrate; a ceramic substrate; a sapphire substrate; a metal substrate whose surface is coated with an insulating film; and the like. It is preferable to use a glass substrate used in the electronics industry because the glass substrate is inexpensive and reduction in cost can be achieved.

A silicon oxide film or a silicon oxynitride film is formed as the insulating film 107 containing silicon and oxygen as its composition. The insulating film 107 containing silicon and oxygen as its composition can be formed to a thickness of greater than or equal to 10 nm and less than or equal to 500 nm, preferably greater than or equal to 50 nm and less than or equal to 200 nm. Note that the insulating film 107 containing silicon and oxygen as its composition contains halogen.

A silicon nitride film or a silicon nitride oxide film is formed as the insulating film 106 containing silicon and nitrogen as its composition. The insulating film 106 containing silicon and nitrogen as its composition can be formed to a thickness of greater than or equal to 10 nm and less than or equal to 200 nm, preferably greater than or equal to 50 nm and less than or equal to 100 nm.

Note that a silicon oxynitride film in this specification means a film which contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. In addition, a silicon nitride oxide film means a film which contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

A film which has a smooth surface and can form a hydrophilic surface is desirably formed as the bonding layer 114. For example, an insulating film such as a silicon oxide film or a film which has siloxane bonds is formed as the bonding layer 114. The bonding layer 114 can be formed to a thickness of greater than or equal to 5 nm and less than or equal to 500 nm, preferably greater than or equal to 10 nm and less than or equal to 100 nm.

An example of a specific manufacturing method is hereinafter described with reference to drawings. FIGS. 2A to 2E and FIGS. 3A to 3E are cross-sectional views illustrating an example of a method for manufacturing a semiconductor device manufacturing substrate of this embodiment mode.

Figure 2A:
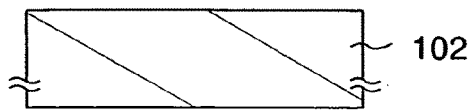
FIGS. 2A to 2E are views illustrating an example of a method for manufacturing a semiconductor device manufacturing substrate.

A semiconductor substrate 102 is prepared (see FIG. 2A). As the semiconductor substrate 102, a semiconductor substrate such as a silicon substrate or a germanium substrate, or a compound semiconductor substrate such as a gallium arsenide substrate or an indium phosphide substrate is used.

Although a single-crystal semiconductor substrate is desirably used as the semiconductor substrate 102, a polycrystalline semiconductor substrate can also be used. In addition, a semiconductor substrate to be used may be either rectangular or circular.

Figure 2B:
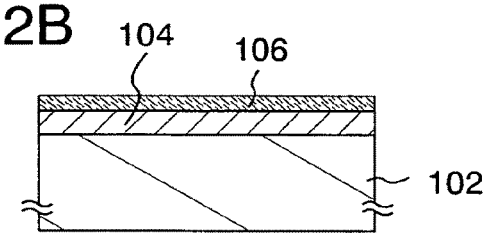

An insulating film 104 containing silicon and oxygen as its composition (hereinafter, also referred to a first insulating film 104 containing silicon and oxygen as its composition) and the insulating film 106 containing silicon and nitrogen as its composition are formed in order over one surface of the semiconductor substrate 102 which has been cleaned (see FIG. 2B). These stacked films are formed on the surface side where the semiconductor substrate 102 forms a bond with the supporting substrate.

The first insulating film 104 containing silicon and oxygen as its composition and the insulating film 106 containing silicon and nitrogen as its composition can be formed by a CVD (chemic vapor deposition) method, a sputtering method, or an ALF (atomic layer epitaxy) method. Note that a CVD method in this specification includes a plasma CVD method, a thermal CVD method, and a photo CVD method in its category. Alternatively, the first insulating film 104 containing silicon and oxygen as its composition can also be formed by heat treatment or plasma treatment under an atmosphere containing oxygen, or oxidation treatment such as UV ozone treatment.

A silicon oxide film or a silicon oxynitride film is formed as the first insulating film 104 containing silicon and oxygen as its composition. The first insulating film 104 containing silicon and oxygen as its composition is formed to a thickness of greater than or equal to 10 nm and less than or equal to 500 nm, preferably greater than or equal to 50 nm and less than or equal to 200 nm.

A silicon nitride film or a silicon nitride oxide film is formed as the insulating film 106 containing silicon and nitrogen as its composition. The insulating film 106 containing silicon and nitrogen as its composition is formed to a thickness of greater than or equal to 10 nm and less than or equal to 200 nm, preferably greater than or equal to 50 nm and less than or equal to 100 nm. The insulating film 106 containing silicon and nitrogen as its composition functions as a blocking film for preventing metal impurities such as alkali metal or alkaline earth metal from diffusing toward a semiconductor film side. Thus, even when a glass substrate made of aluminosilicate glass or the like is used as the supporting substrate which is to be bonded later, the insulating film 106 containing silicon and nitrogen as its composition can block diffusion of metal impurities such as sodium contained in the glass substrate.

Note that, although the blocking effect can be obtained if the insulating film 106 containing silicon and nitrogen as its composition is formed so as to be directly in contact with the semiconductor substrate 102, interface characteristics might be deteriorated due to formation of trap levels. In order to prevent such a defect, the first insulating film 104 containing silicon and oxygen as its composition is desirably formed between the semiconductor substrate 102 and the insulating film 106 containing silicon and nitrogen as its composition. The first insulating film 104 containing silicon and oxygen as its composition and the insulating film 106 containing silicon and nitrogen as its composition are stacked from the semiconductor film 140 side, whereby improvement of electric characteristics of the interface can be realized while contamination of the semiconductor film due to metal impurities can be prevented.

Note that the first insulating film 104 containing silicon and oxygen as its composition and the insulating film 106 containing silicon and nitrogen as its composition are desirably formed successively. This is because successive formation makes it possible to prevent contamination of the interface.

Figure 2C:
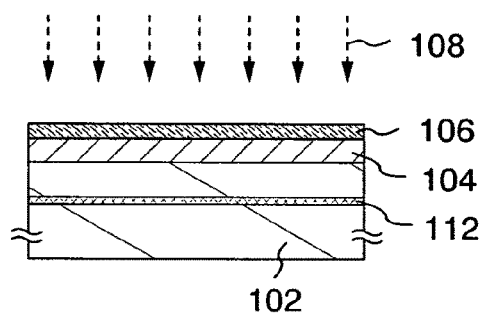

Next, the semiconductor substrate 102 is irradiated with ions 108 accelerated by an electric field, whereby a separation layer 112 is formed in a region at a predetermined depth in the semiconductor substrate 102 (see FIG. 2C). In this embodiment mode, the ions 108 are emitted from the surface side of the semiconductor substrate 102 where the first insulating film 104 containing silicon and oxygen as its composition and the insulating film 106 containing silicon and nitrogen as its composition are formed.

The depth of the semiconductor substrate 102 where the separation layer 112 is formed can be controlled by the type of emitted ions 108, the acceleration voltage thereof, and the emission angle thereof. The separation layer 112 is formed in a region at a depth which is close to the average penetration depth of the ions from a surface of the semiconductor substrate 102. The depth of the semiconductor substrate where the separation layer 112 is formed determines the thickness of a semiconductor film which is to be transferred to the supporting substrate later. Thus, the acceleration voltage at the time of the irradiation with the ions 108 and the dose of the ions 108 are adjusted in consideration of the thickness of the semiconductor film which is to be transferred. It is desirable that the irradiation with the ions 108 be controlled so that the semiconductor film is formed to a thickness of greater than or equal to 5 nm and less than or equal to 500 nm, preferably greater than or equal to 10 nm and less than or equal to 200 nm.

The irradiation with the ions 108 is desirably performed using an ion doping apparatus. In other words, an ion doping method is desirably used which performs irradiation with plural kinds of ions which are generated by plasma excitation of a source gas without any mass separation being performed. In this embodiment mode, irradiation with ions made up of one or a plurality of same atoms that have a single mass or ions made up of one or a plurality of same atoms that have different masses is desirable. Such ion doping may be performed with an acceleration voltage of greater than or equal to 10 kV and less than or equal to 100 kV, preferably greater than or equal to 30 kV and less than or equal to 80 kV, at a dose of greater than or equal to $1 \times 10^{16}$ ions/cm$^2$ and less than or equal to $4 \times 10^{16}$ ions/cm$^2$, and with a beam current density of greater than or equal to 2 μA/cm$^2$, preferably greater than or equal to 5 μA/cm$^2$, further preferably greater than or equal to 10 μA/cm$^2$.

As the ions 108, ions made up of one or a plurality of same atoms that have a single mass or ions made up of one or a plurality of same atoms that have different masses generated by plasma excitation of a source gas selected from hydrogen and deuterium are desirably emitted. When irradiation with hydrogen ions is performed, it is desirable that the ions of hydrogen include H$^+$ ions, H$_2^+$ ions, and H$_3^+$ ions with a high proportion of H$_3^+$ ions because ion irradiation efficiency can be increased and irradiation time can be shortened. Accordingly, a region of the semiconductor substrate 102 where the separation layer 112 is formed can be made to contain hydrogen at greater than or equal to $1 \times 10^{20}$ atoms/cm$^3$ (preferably, $1 \times 10^{21}$ atoms/cm$^3$). When a high-concentration hydrogen-doped region is locally formed in the semiconductor substrate 102, a crystal structure is disordered and microvoids are formed, whereby the separation layer 112 can be made to have a porous structure. In this case, by heat treatment at relatively low temperature, a change occurs in the volume of the microvoids formed in the separation layer 112. Then, cleavage is performed along the separation layer 112, whereby a thin semiconductor film can be formed.

Note that the separation layer 112 can be formed in a similar manner even if the semiconductor substrate 102 can be irradiated with a specific type of ions with mass separation being performed. Also in this case, selective irradiation with ions which have large mass is desirable because an effect which is similar to the above-described effect can be obtained.

Note that there is the case where the ions 108 are implanted at a high dose in order to form the separation layer 112 at a predetermined depth. In this embodiment mode, the semiconductor substrate 102 is irradiated with the ions 108 through the stacked film of the first insulating film 104 containing silicon and oxygen as its composition and the insulating film 106 containing silicon and nitrogen as its composition which are formed over the semiconductor substrate 102, and thus roughness of the surface of the semiconductor substrate 102 due to introduction of ions can be prevented.

Figure 2D:
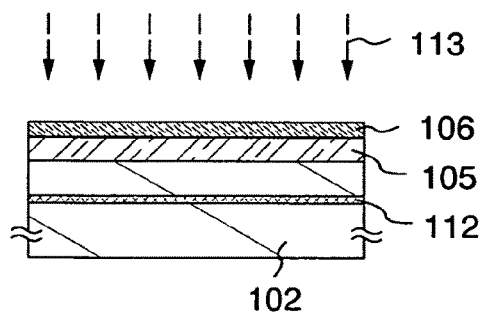

Next, the first insulating film 104 containing silicon and oxygen as its composition is irradiated with halogen ions 113 accelerated by an electric field, whereby an insulating film 105 containing silicon and oxygen as its composition (hereinafter, referred to as a second insulating film 105 containing silicon and oxygen as its composition) is obtained which is the first insulating film 104 containing silicon and oxygen as its composition in which halogen is contained (see FIG. 2D).

The first insulating film 104 containing silicon and oxygen as its composition is irradiated with the halogen ions 113 which have passed through the insulating film 106 containing silicon and nitrogen as its composition, whereby a halogen element which forms the halogen ions 113 are introduced into the first insulating film 104 containing silicon and oxygen as its composition. The depth to which the halogen ions 113 are introduced can be controlled by the type of halogen ions 113, the acceleration voltage thereof, and the emission angle thereof.

The irradiation with the halogen ions 113 can be performed using an ion doping apparatus or an ion irradiation apparatus. In other words, an ion doping method can be desirably used which performs irradiation with plural kinds of ions without any mass separation being performed, or an ion irradiation method can be used which performs irradiation with a specific type of ion with mass separation being performed. For example, the first insulating film 104 containing silicon and oxygen as its composition can be irradiated with the halogen ions 113 at an acceleration voltage of greater than or equal to 30 kV and less than or equal to 100 kV and at a dose of greater than or equal to $1\times10^{14}$ ions/cm$^2$ and less than or equal to $1\times10^{16}$ ions/cm$^2$.

A halogen element such as fluorine or chlorine may be ionized as the halogen ions 113, and fluorine is preferably used. Although halogen can be uniformly distributed in the second insulating film 105 containing silicon and oxygen as its composition, in many cases, distribution is performed in accordance with the Gaussian distribution when irradiation with ions are performed. That is, a high-concentration region of halogen is formed at a predetermined depth in the second insulating film 105 containing silicon and oxygen as its composition, and the halogen is widely distributed according to the concentration of the high-concentration region as a peak concentration. Here, halogen is desirably contained in the second insulating film 105 containing silicon and oxygen as its composition at a peak concentration of the range of $1\times10^{19}$ atoms/cm$^3$ to $1\times10^{21}$ atoms/cm$^3$.

Figure 2E:
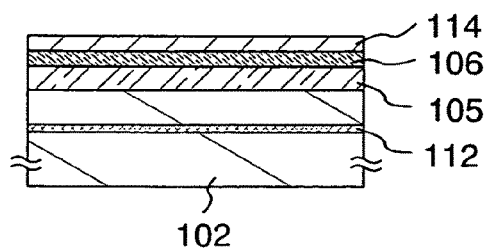
Figure 3A:
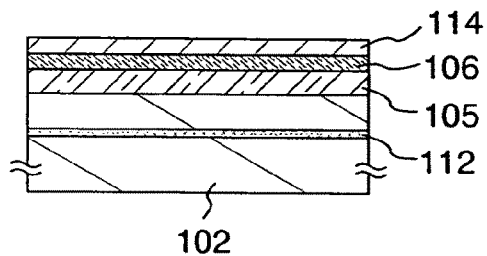
FIGS. 3A to 3E are views illustrating an example of a method for manufacturing a semiconductor device manufacturing substrate.

Next, the bonding layer 114 is formed over the insulating film 106 containing silicon and nitrogen as its composition (see FIG. 2E and FIG. 3A).

A film which has a smooth surface and can form a hydrophilic surface is desirably formed as the bonding layer 114. An insulating film formed by chemical reaction is desirably used as such a bonding layer 114. For example, an insulating film formed by thermal reaction or chemical reaction is suitable. This is because an insulating film which is formed by chemical reaction easily obtains the smoothness of its surface. The bonding layer 114 which has a smooth surface and forms a hydrophilic surface is desirably formed to a thickness of greater than or equal to 5 nm and less than or equal to 500 nm, preferably greater than or equal to 10 nm and less than or equal to 100 nm. The bonding layer 114 is formed to a thickness of the above-described range, whereby it is possible to smooth roughness of a surface over which a film is to be formed and also to ensure smoothness of a growing surface of the film.

As the bonding layer 114 which satisfies such conditions, a silicon oxide film formed by a CVD method with use of organic silane as a source gas is desirably used. As organic silane, the following can be used: a silicon-containing compound such as tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). Note that, when a silicon oxide film is formed by a CVD method with use of organic silane as a source gas, a gas imparting oxygen is desirably mixed. Oxygen, nitrous oxide, nitrogen dioxide, or the like can be used as a gas imparting oxygen. In addition, an inert gas such as argon, helium, or nitrogen or a hydrogen gas may be mixed. Alternatively, a silicon oxide film formed by a CVD method with use of inorganic silane such as monosilane, disilane, or trisilane as a source gas can also be used as the bonding layer 114. Also in this case, a gas imparting oxygen, an inert gas, or the like is desirably mixed. Note that the bonding layer 114 is desirably formed at a temperature which is lower than the temperature of the heat treatment performed later for separating the semiconductor film from the semiconductor substrate such as a single-crystal semiconductor substrate or a polycrystalline semiconductor substrate. For example, the bonding layer 114 is formed at a temperature of less than or equal to 350° C.

Further alternatively, a film having siloxane (Si—O—Si) bonds can also be used as the bonding layer 114. Note that a film which has siloxane bonds in this specification refers to a film in which a bond of silicon (Si) and oxygen (O) is included and a skeleton structure is formed by the bond of silicon and oxygen. Siloxane has a substituent. An organic group containing at least hydrogen (e.g., an alkyl group or an aromatic hydrocarbon) is given as a substituent. Alternatively, a fluoro group may be used. Further alternatively, a fluoro group and an organic group containing at least hydrogen may be used. Note that a film which has siloxane bonds can be formed by an application method such as a spin coating method.

Figure 3B:
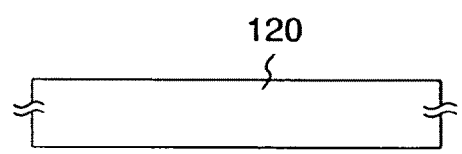

The supporting substrate 120 is prepared (see FIG. 3B). As described above, a substrate with an insulating surface or a substrate with an insulating property is used as the supporting substrate 120. Specifically, the following are given: various glass substrates used in the electronics industry, such as an aluminosilicate glass substrate, an aluminoborosilicate glass substrate, or a barium borosilicate glass substrate; a quartz substrate, a ceramic substrate; a sapphire substrate; a metal substrate whose surface is coated with an insulating film; and the like.

Figure 3C:
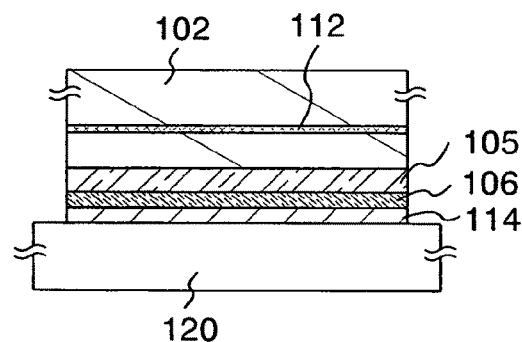

The semiconductor substrate 102 and the supporting substrate 120 are superimposed on each other and bonded to each other with the second insulating film 105 containing silicon and oxygen as its composition, the insulating film 106 containing silicon and nitrogen as its composition, and the bonding layer 114 which are stacked in order over the semiconductor substrate 102 interposed therebetween (see FIG. 3C).

Surfaces of the semiconductor substrate 102 and the supporting substrate 120 which form a bond are sufficiently cleaned in advance. Then, the supporting substrate 120 and the bonding layer 114 which is the top layer of the stacked films formed over the semiconductor substrate 102 are disposed in contact with each other, whereby a bond is formed. It is considered that Van der Waals force acts on the bonding at an early stage and a strong bond can be formed by a hydrogen bond which is formed by pressure bonding of the supporting substrate 120 and the semiconductor substrate 102.

Note that heat treatment or pressure treatment is desirably performed after the supporting substrate 120 and the semiconductor substrate 102 are bonded to each other. Heat treatment or pressure treatment makes it possible to increase the bond strength. Heat treatment is performed at a temperature which is less than or equal to the heat resistance temperature of the supporting substrate 120 and also does not exceed the temperature of the heat treatment for separating the semiconductor substrate, which is performed later. Pressure treatment is performed so that pressure is applied in a direction perpendicular to the bonding surface and in consideration of the pressure resistance of the supporting substrate 120 and the semiconductor substrate 102.

In addition, in order to form a good bond between the semiconductor substrate 102 and the supporting substrate 120, one or both of the bonding surfaces may be activated before the supporting substrate 120 and the semiconductor substrate 102 are disposed in contact with each other. For example, the bonding surface can be activated by irradiation with an atomic beam or an ion beam, specifically, an atomic beam of an inert gas such as argon or an ion beam thereof. Alternatively, the bonding surface can be activated by radical treatment. Such surface activation treatment makes it possible to increase the bond strength between different materials. Alternatively, one or both of the bonding surfaces may be cleaned with ozone-containing water, oxygen-containing water, hydrogen-containing water, pure water, or the like. Treatment for making the bonding surface hydrophilic is added in this manner, whereby an OH group of the bonding surface can be increased. As a result, bond by a hydrogen bond can be further strengthened.

Next, heat treatment is performed, whereby part of the semiconductor substrate 102 is separated at the separation layer 112. The semiconductor substrate 102 is bonded to the supporting substrate 120 with the insulating films interposed therebetween and part of the semiconductor substrate 102 is separated at the separation layer 112; accordingly, the semiconductor film 140 remains over the supporting substrate 120 (see FIG. 3D).

Heat treatment is desirably performed at a temperature of greater than or equal to the deposition temperature of the bonding layer 114 and less than or equal to the strain point of the supporting substrate 120. By the heat treatment, a change occurs in the volume of the microvoids formed in the separation layer 112, and the semiconductor substrate 102 can be cleaved along the separation layer 112. A state is obtained in which the bonding layer 114 formed over the semiconductor substrate 102 is bonded to the supporting substrate 120 and the semiconductor film 140 with the same crystallinity as the semiconductor substrate 102 remains over the supporting substrate 120. For example, a single-crystal silicon substrate is used as the semiconductor substrate 102 and a glass substrate is used as the supporting substrate 120, whereby a single-crystal silicon film can be formed over the glass substrate with the insulating films interposed therebetween. Note that, when a glass substrate is used as the supporting substrate 120, heat treatment is desirably performed at a temperature of less than or equal to 650° C.

Figure 3D:
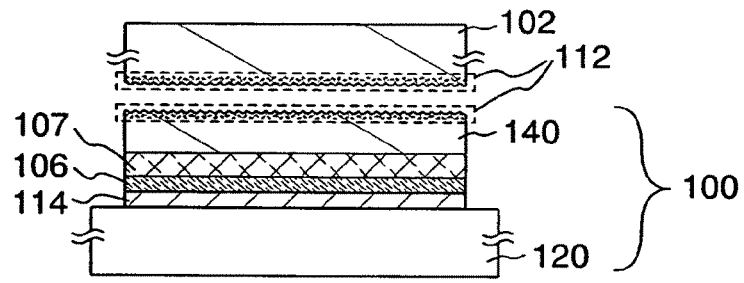
Figure 3E:
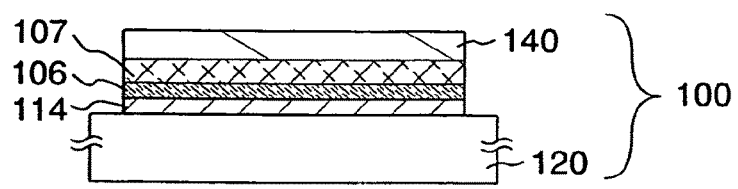

Note that at the time of the heat treatment shown in FIG. 3D, by heat treatment at desirably greater than or equal to 550° C. for 30 minutes or more, halogen contained in the second insulating film 105 containing silicon and oxygen as its composition is distributed again and diffused toward the semiconductor film 140 (the semiconductor substrate 102) side. In this embodiment mode, the semiconductor film 140 is formed in such a manner that the semiconductor substrate 102 is separated by embrittlement and heat treatment by irradiation with ions generated using hydrogen as a source gas, and a large number of dangling bonds are formed at the separation surface (a region which serves as a cleavage surface) at which the semiconductor film 140 is separated and in the semiconductor film 140. In addition, dangling bonds are also formed at an interface with the second insulating film 105 containing silicon and oxygen as its composition which is under the semiconductor film 140 due to interruption of a bond between atoms at the interface. Halogen diffused from the second insulating film 105 containing silicon and oxygen as its composition has a function of terminating dangling bonds at the separation surface of the semiconductor film 140, in the semiconductor film 140, and at the interface between the semiconductor film 140 and the second insulating film 105 containing silicon and oxygen as its composition. For example, when the semiconductor film 140 is a silicon film and the second insulating film 105 containing silicon and oxygen as its composition contains fluorine, Si—F bonds are generated in regions where dangling bonds are terminated.

Halogen is contained in the semiconductor film 140 terminated by halogen. The amount of halogen contained in the semiconductor film 140 depends on the amount of generated dangling bonds in the semiconductor film 140 and the relationship between the temperature of the heat treatment for separating the semiconductor substrate and the diffusion coefficient of halogen contained in the second insulating film 105 containing silicon and oxygen as its composition. Halogen is desirably contained in the semiconductor film 140 at a peak concentration of the range of $1\times10^{17}$ atoms/cm$^3$ to $1\times10^{21}$ atoms/cm$^3$. Note that halogen contained in the semiconductor film 140 is uniformly distributed in some cases or has a local peak concentration and is distributed after being diffused from a region having the peak concentration in some cases. In addition, in some cases, since halogen contained in the semiconductor film 140 (the semiconductor substrate 102 before separation at the separation layer 112) is diffused from the second insulating film 105 containing silicon and oxygen as its composition which is in contact with the semiconductor film 140, the halogen has a peak concentration in the vicinity of the interface with the second insulating film 105 containing silicon and oxygen as its composition, and the halogen is distributed so that the concentration is decreased from the vicinity of the interface to the separation surface of the semiconductor film 140.

Here, a halogen element, especially fluorine, has high electronegativity. Thus, the bond energy is higher and a stable structure is formed more easily in the case where a halogen element forms a bond with one element, compared with the case where an element other than the halogen element forms a bond with the one element. For example, although it is known that a semiconductor film such as a silicon film is terminated by hydrogen, hydrogen is easily desorbed from silicon by heat treatment performed at about 400° C. On the other hand, halogen typified by fluorine has higher bond energy with silicon than hydrogen, and thus halogen can exist more stably than hydrogen. Thus, halogen is diffused in a semiconductor film or at an interface thereof, whereby effective termination of dangling bonds can be realized. That is, the heat treatment shown in FIG. 3D is performed at greater than or equal to 550° C. and less than or equal to the strain point of the supporting substrate 120, and at greater than or equal to 550° C. and less than or equal to 650° C. when a glass substrate is used as the supporting substrate 120, whereby the semiconductor substrate 102 can be separated at the separation layer 112 and also termination of dangling bonds in the obtained semiconductor film 140 can be realized.

Alternatively, dangling bonds can be terminated in such a manner that halogen is directly introduced into the semiconductor substrate or the semiconductor film. However, direct introduction of halogen causes greater damage to the semiconductor substrate or the semiconductor film. Thus, halogen which is contained in an insulating film (here, the second insulating film 105 containing silicon and oxygen as its composition) in advance is distributed again, whereby termination of dangling bonds can be realized while damage to the semiconductor film can be suppressed.

A dangling bond is a structural defect and might cause adverse effects such as deterioration of semiconductor characteristics if it exists in a semiconductor film or at an interface thereof. Therefore, termination by halogen makes it possible to improve semiconductor characteristics and realize manufacture of a semiconductor device which has good electric characteristics.

In addition, by heat treatment, halogen contained in the second insulating film 105 containing silicon and oxygen as its composition is distributed again to be diffused toward the semiconductor film 140 (the semiconductor substrate 102) side, and thus the amount of halogen contained in the second insulating film 105 containing silicon and oxygen as its composition is decreased. That is, after the heat treatment, an insulating film 107 containing silicon and oxygen as its composition (hereinafter, referred to as a third insulating film 107 containing silicon and oxygen as its composition) is obtained which is the second insulating film 105 containing silicon and oxygen as its composition in which the amount of contained halogen is decreased.

Note that halogen is contained in the third insulating film 107 containing silicon and oxygen as its composition, whereby a gettering effect of metal impurities and a blocking effect thereof can be obtained. Thus, contamination of the semiconductor film 140 due to metal impurities can be prevented.

In addition, by heat treatment for separating the semiconductor substrate 102, the bond strength at a bonding surface of the supporting substrate 120 and the semiconductor substrate 102 can be increased. Moreover, heat treatment for increasing the bond strength may be performed before the heat treatment for separating the semiconductor substrate 102 so that heat treatment of two or more stages is performed. For example, after heat treatment is performed at a temperature of greater than or equal to 200° C. and less than or equal to 400° C., another heat treatment may be performed at a temperature of greater than or equal to 550° C.

By the separation of the semiconductor substrate 102, a semiconductor device manufacturing substrate which has an SOI structure in which the semiconductor film 140 is bonded to the supporting substrate 120 with the bonding layer 114, the insulating film 106 containing silicon and nitrogen as its composition, and the third insulating film 107 containing silicon and oxygen as its composition interposed therebetween is manufactured. The semiconductor film 140 and the interface thereof are terminated by halogen when heat treatment for separating the semiconductor substrate 102 is performed. In addition, the insulating film 106 containing silicon and nitrogen as its composition which has a high blocking effect is formed between the semiconductor film 140 and the supporting substrate 120. Thus, a semiconductor device which has good electric characteristics and high reliability can be manufactured with use of the semiconductor device manufacturing substrate obtained in this embodiment mode.

Note that flatness of the surface of the semiconductor film 140 which is transferred to the supporting substrate 120 is damaged due to the irradiation step with ions and the separation step, and the surface is uneven. The separation layer 112 remains on the surface of the semiconductor film 140 in some cases. If the surface of the semiconductor film 140 is uneven, it becomes difficult to form a thin gate insulating film with excellent withstand voltage when forming a semiconductor device with use of the obtained semiconductor device manufacturing substrate. Therefore, it is desirable to perform planarization treatment on the semiconductor film 140 (see FIG. 3E).

For example, as the planarization treatment, chemical mechanical polishing (CMP) is desirably performed on the semiconductor film 140. Alternatively, the semiconductor film 140 may be planarized by irradiation with a laser beam or heat treatment with an electric furnace, a lamp annealing furnace, a rapid thermal annealing (RTA) apparatus, or the like. Further alternatively, the semiconductor film 140 may be planarized by a combination of CMP treatment and irradiation with a laser beam or heat treatment. Note that not only can planarization of the semiconductor film be realized but also crystal defects, damages, or the like can be repaired by irradiation of the semiconductor film 140 with a laser beam or heat treatment performed on the semiconductor film 140. In addition, a damaged layer of the surface due to CMP treatment can be repaired by irradiation with a laser beam or heat treatment after CMP treatment. Furthermore, CMP treatment or the like may be performed for the purpose of thinning the obtained semiconductor film.

Note that the semiconductor film is desirably irradiated with a laser beam under a nitrogen atmosphere with an oxygen concentration of less than or equal to 10 ppm. This is because the surface of the semiconductor film might get rough if irradiation with a laser beam is performed under an oxygen atmosphere. In addition, it is desirable that after the semiconductor film is irradiated with a laser beam, heat treatment be performed again at greater than or equal to 550° C. to again diffuse halogen contained in the insulating film containing silicon and oxygen as its composition which is under the semiconductor film. This is because, in some cases, halogen which terminates dangling bonds in the semiconductor film is desorbed if the semiconductor film is irradiated with a laser beam. Note that heat treatment of the semiconductor film is performed in order to terminate dangling bonds which are generated again due to desorption of halogen, and thus it is desirable that heat treatment of the semiconductor film be performed using the temperature of the heat treatment for separating the semiconductor substrate at the separation layer as an upper limit.

A variety of semiconductor devices can be manufactured with use of the semiconductor device manufacturing substrate which is manufactured as described above.

Note that, although the example in which the area of the supporting substrate 120 is bigger than that of the semiconductor substrate 102 is described with reference to drawings in this embodiment mode, the present invention is not particularly limited thereto. As the supporting substrate 120, a substrate with approximately the same area as the semiconductor substrate 102 may be used. Alternatively, a substrate with a different shape from the semiconductor substrate 102 may be used as the supporting substrate 120.

In addition, the semiconductor substrate 102 from which the semiconductor film 140 has been separated can be reused. That is, the semiconductor substrate 102 separated as shown in FIG. 3D can be reused as the semiconductor substrate 102 shown in FIG. 2A. Note that it is desirable that the separation surface of the semiconductor film 140 (the separation layer 112 serving as a cleavage surface) be planarized when the semiconductor substrate 102 is reused. The planarization treatment here may be performed in a similar manner to the above-described planarization of the semiconductor film 140, and CMP treatment, irradiation with a laser beam, heat treatment, or the like may be used as appropriate. In addition, planarization or repair of crystal defects may be performed with a combination of some kinds of treatment. The semiconductor substrate which serves as a base is reused when manufacturing the semiconductor device manufacturing substrate, whereby drastic cost reduction can be realized. Needless to say, the semiconductor substrate 102 from which the semiconductor film 140 has been separated may also be used for purposes other than manufacture of the semiconductor device manufacturing substrate.

Note that a bonding layer may also be provided on the supporting substrate 120 side. An example of a method for manufacturing a semiconductor device manufacturing substrate in which a bonding layer is provided on the supporting substrate 120 side is described with reference to FIGS. 4A to 4E.

The semiconductor substrate 102 is prepared, and the first insulating film containing silicon and oxygen as its composition and the insulating film 106 containing silicon and nitrogen as its composition are stacked in order over one of surfaces of the cleaned semiconductor substrate 102. Irradiation with ions which are obtained by ionization of hydrogen or deuterium is performed from the side of the semiconductor substrate 102, where the first insulating film containing silicon and oxygen as its composition and the insulating film 106 containing silicon and nitrogen as its composition are formed, whereby the separation layer 112 is formed at a predetermined depth in the semiconductor substrate 102. Next, halogen ions are made to pass through the insulating film 106 containing silicon and nitrogen as its composition and the first insulating film containing silicon and oxygen as its composition is irradiated with the halogen ions, whereby the second insulating film 105 containing silicon and oxygen as its composition is obtained. Then, the bonding layer 114 is formed over the insulating film 106 containing silicon and nitrogen as its composition (see FIG. 4A). Note that the description of FIG. 4A follows the descriptions of FIGS. 2A to 2E.

The supporting substrate 120 is prepared. Then, a bonding layer 124 is formed over the supporting substrate 120 (see FIG. 4B). Here, an example in which the bonding layer 124 is formed over the supporting substrate 120 with a barrier film 122 interposed therebetween is described.

As described above, a substrate with an insulating surface or a substrate with an insulating property is used as the supporting substrate 120. Specifically, the following are given: various glass substrates used in the electronics industry, such as an aluminosilicate glass substrate, an aluminoborosilicate glass substrate, or a barium borosilicate glass substrate; a quartz substrate; a ceramic substrate; a sapphire substrate; a metal substrate whose surface is coated with an insulating film; and the like.

A film which has a smooth surface and can form a hydrophilic surface, which is similar to the film used as the bonding layer 114 is desirably formed as the bonding layer 124. For example, a silicon oxide film which is formed by a CVD method using organic silane such as TEOS, or inorganic silane such as monosilane as a source gas; a film which has siloxane bonds; or the like can be used.

The deposition temperature of the bonding layer 124 is needed to be less than or equal to the strain point of the supporting substrate 120. For example, when a glass substrate is used as the supporting substrate 120, the deposition temperature of the bonding layer 124 is desirably less than or equal to the strain point of glass, preferably less than or equal to 650° C.

Note that, when a glass substrate used in the electronics industry, such as an aluminosilicate glass substrate, an aluminoborosilicate glass substrate, or a barium borosilicate glass substrate is used as the supporting substrate 120, the cost of the substrate is inexpensive and cost reduction can be achieved. However, a small amount of metal impurities, for example, alkali metal such as sodium or alkaline earth metal is contained in the glass substrate, and the metal impurities are diffused from the supporting substrate to the semiconductor film and might have an adverse effect on the characteristics of a semiconductor device to be manufactured. As described above, a blocking effect of metal impurities is obtained by the insulating film 106 containing silicon and nitrogen as its composition provided on the semiconductor substrate 102 side, and the blocking effect can be increased by provision of another barrier film 122 which is capable of blocking metal impurities on the supporting substrate 120 side. The barrier film 122 can be formed as a single-layer film or a stacked-layer film and can be formed to a thickness of greater than or equal to 10 nm and less than or equal to 400 nm. The barrier film 122 includes at least one layer which has a high effect of blocking metal impurities such as alkali metal or alkaline earth metal. As such a film, there are a silicon nitride film, a silicon nitride oxide film, an aluminum nitride film, and the like.

For example, when the barrier film 122 is formed as a single-layer film, a silicon nitride film, a silicon nitride oxide film, or an aluminum nitride film can be formed to a thickness of greater than or equal to 10 nm and less than or equal to 200 nm. When the barrier film 122 is formed as two-layer stacked structure, for example, a stacked film of a silicon nitride film and a silicon oxide film; a stacked film of a silicon nitride film and a silicon oxynitride film; a stacked film of silicon nitride oxide film and a silicon oxide film; or a stacked film of a silicon nitride oxide film and a silicon oxynitride film can be formed. Note that, as for the two-layer films which are exemplified, the first mentioned film is preferably formed over the supporting substrate 120. This is because a film with a higher blocking effect is formed as a lower layer (on the supporting substrate 120 side) and a film which reduces the internal stress of the lower layer is formed as an upper layer (on the bonding layer 124 side) in the two-layer barrier film 122 so that the semiconductor film is not affected by the internal stress of the barrier film 122.

Figure 4A:
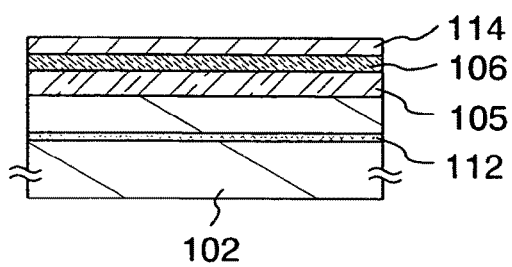
FIGS. 4A to 4E are views illustrating an example of a method for manufacturing a semiconductor device manufacturing substrate.
Figure 4B:
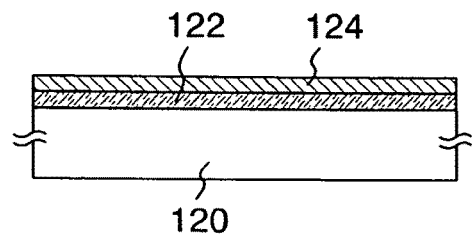
Figure 4C:
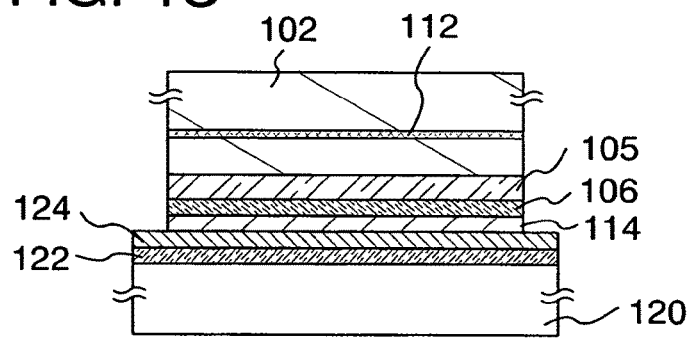

The semiconductor substrate 102 and the supporting substrate 120 are superimposed on each other and bonded to each other with the second insulating film 105 containing silicon and oxygen as its composition, the insulating film 106 containing silicon and nitrogen as its composition, and the bonding layer 114 which are stacked in order over the semiconductor substrate 102 interposed therebetween and also with the barrier film 122 and the bonding layer 124 which are stacked in order over the supporting substrate 120 interposed therebetween (see FIG. 4C).

Here, the bonding layer 124 formed over the supporting substrate 120 and the bonding layer 114 formed over the semiconductor substrate 102 are made to face each other to be disposed in contact with each other, whereby a bond is formed. Note that the bonding surfaces which form the bond are sufficiently cleaned in advance. A strong bond by a hydrogen bond can be formed by pressure bonding of the supporting substrate 120 and the semiconductor substrate 102. A structure in which the bonding layer 114 and the bonding layer 124 are bonded to each other makes it possible to increase the bond strength between the bonding layers 114 and 124. Note that, in order to form a good bond between the supporting substrate 120 and the semiconductor substrate 102, activation (including hydrophilization) of one or both of the bonding surfaces of the bonding layer 114 and the bonding layer 124 may be performed. Heat treatment or pressure treatment performed after bonding the supporting substrate 120 and the semiconductor substrate 102 makes it possible to increase the bond strength. Note that when heat treatment is performed, the temperature is set so as not to exceed the temperature of the heat treatment for separating the semiconductor substrate, which is performed later.

Figure 4D:
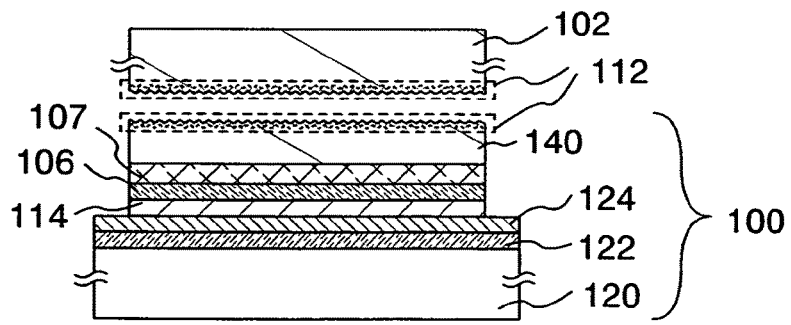
Figure 4E:
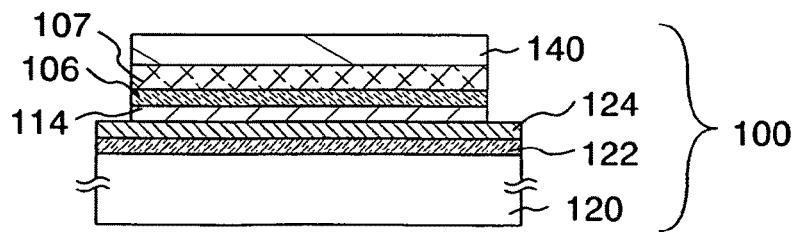

Heat treatment is performed to separate part of the semiconductor substrate 102 at the separation layer 112, whereby an SOI structure in which the semiconductor film 140 is bonded to the supporting substrate 120 is obtained (see FIG. 4D). Planarization treatment is desirably performed on the semiconductor film 140 (see FIG. 4E). The descriptions of FIGS. 4D and 4E follow the descriptions of FIGS. 3D and 3E, respectively.

By the heat treatment shown in FIG. 4D, halogen contained in the second insulating film 105 containing silicon and oxygen as its composition is distributed again and diffused to the semiconductor film 140 (the semiconductor substrate 102) side. As a result, dangling bonds at the separation surface of the semiconductor film 140, in the semiconductor film 140, and at an interface between the semiconductor film 140 and the insulating film containing silicon and oxygen as its composition are terminated. For example, when the semiconductor film 140 is a silicon film and the second insulating film 105 containing silicon and oxygen as its composition contains fluorine, Si—F bonds are generated in regions where dangling bonds are terminated.

Note that, since halogen is diffused from the second insulating film 105 containing silicon and oxygen as its composition to the semiconductor film 140 by the heat treatment, the amount of halogen contained in the second insulating film 105 containing silicon and oxygen as its composition is decreased. Thus, after the heat treatment, a third insulating film 107 containing silicon and oxygen as its composition is obtained which is the second insulating film 105 containing silicon and oxygen as its composition in which the amount of halogen is decreased. Note that halogen is contained in the third insulating film 107 containing silicon and oxygen as its composition, whereby a gettering effect of metal impurities can be expected.

The semiconductor film 140 is terminated by halogen, and halogen is contained in the semiconductor film 140. The amount of halogen contained in the semiconductor film 140 depends on the amount of dangling bonds in the semiconductor film 140 and the relationship between the temperature of the heat treatment and the diffusion coefficient of halogen. Here, halogen is desirably contained in the semiconductor film 140 at a peak concentration of greater than or equal to $1\times10^{17}$ atoms/cm$^3$ and less than or equal to $1\times10^{21}$ atoms/cm$^3$.

Through the above-described steps, the semiconductor device manufacturing substrate 100 can be manufactured in which the semiconductor film 140 is bonded to the supporting substrate 120 with the barrier film 122, the bonding layer 124, the bonding layer 114, the insulating film 106 containing silicon and nitrogen as its composition, and the third insulating film 107 containing silicon and oxygen as its composition which are stacked in order over the supporting substrate 120 interposed therebetween.

Alternatively, the silicon oxide film provided over the semiconductor substrate 102 can be formed of a thermal oxide film. Hereinafter, the description is made on the case with reference to FIGS. 5A to 5E and FIGS. 6A to 6E.

Figure 5A:
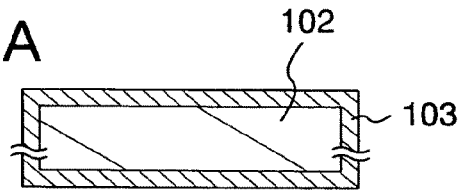
FIGS. 5A to 5E are views illustrating an example of a method for manufacturing a semiconductor device manufacturing substrate.

The semiconductor substrate 102 is prepared, and the cleaned semiconductor substrate 102 is thermally oxidized, whereby a thermal oxide film 103 (hereinafter, referred to as a first thermal oxide film 103) is formed (see FIG. 5A).

As the semiconductor substrate 102, for example, a semiconductor substrate such as a silicon substrate or a germanium substrate, and a compound semiconductor substrate such as a gallium arsenide substrate or an indium phosphide substrate are given. Here, a single-crystal silicon substrate is used.

For thermal oxidation, wet oxidation may be performed, and dry oxidation is preferably performed. For example, thermal oxidation may be performed under an oxygen atmosphere at a temperature of greater than or equal to 800° C. and less than or equal to 1200° C., preferably at greater than or equal to 1000° C. and less than or equal to 1100° C. Although the thickness of the first thermal oxide film 103 may be determined as appropriate by a practitioner, the first thermal oxide film 103 is formed to a thickness of greater than or equal to 10 nm and less than or equal to 500 nm, preferably greater than or equal to 50 nm and less than or equal to 200 nm. The thickness of the first thermal oxide film 103 can be controlled by a treatment atmosphere, processing time, or the like. Note that the thickness of the semiconductor substrate 102 is reduced in some cases because the semiconductor substrate 102 is thermally oxidized. Here, a single-crystal silicon substrate is used as the semiconductor substrate 102, and a silicon oxide film is formed as the first thermal oxide film 103.

Figure 5B:
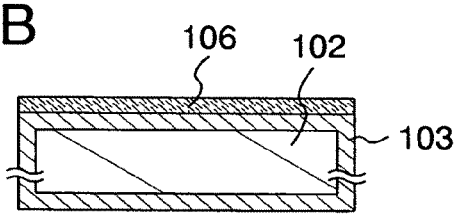
Figure 5C:
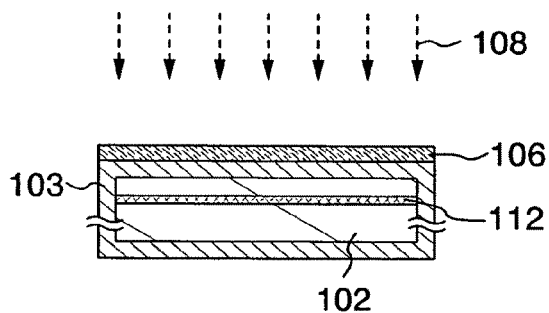
Figure 5D:
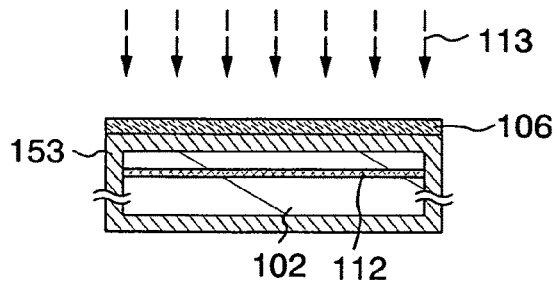

The insulating film 106 containing silicon and nitrogen as its composition is formed over one of surfaces of the semiconductor substrate 102, where the first thermal oxide film 103 is formed (see FIG. 5B). Irradiation with ions 108 which are obtained by ionization of hydrogen or deuterium is performed from the side of the semiconductor substrate 102, where the insulating film 106 containing silicon and nitrogen as its composition is formed with the first thermal oxide film 103 interposed therebetween, whereby the separation layer 112 is formed at a predetermined depth in the semiconductor substrate 102 (see FIG. 5C). The descriptions of FIGS. 5B and 5C follow the descriptions of FIGS. 2B and 2C, respectively.

Next, the halogen ions 113 are made to pass through the insulating film 106 containing silicon and nitrogen as its composition and the first thermal oxide film 103 is irradiated with the halogen ions 113, whereby a thermal oxide film 153 (hereinafter, referred to as a second thermal oxide film 153) containing halogen is obtained.

The first thermal oxide film 103 is desirably irradiated with the halogen ions 113 under the following conditions: an acceleration voltage of greater than or equal to 30 kV and less than or equal to 100 kV, a dose of approximately greater than or equal to $1\times10^{14}$ ions/cm$^2$ and less than or equal to $1\times10^{16}$ ions/cm$^2$. Irradiation is performed under such conditions, whereby halogen can be contained in the second thermal oxide film 153 at a peak concentration of the range of $1\times10^{19}$ atoms/cm$^3$ to $1\times10^{21}$ atoms/cm$^3$. In addition, halogen is contained in the second thermal oxide film 153 in accordance with a Gaussian distribution.

Figure 5E:
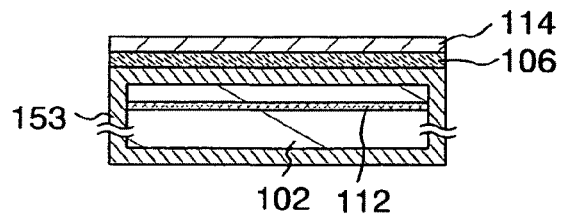
Figure 6A:
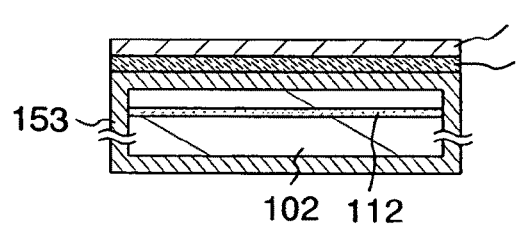
FIGS. 6A to 6E are views illustrating an example of a method for manufacturing a semiconductor device manufacturing substrate.

Next, the bonding layer 114 is formed over the insulating film 106 containing silicon and nitrogen as its composition (see FIG. 5E and FIG. 6A). A film which has a smooth surface and can form a hydrophilic surface is desirably formed as the bonding layer 114. For example, a silicon oxide film or a film which has siloxane bonds may be formed as the bonding layer 114. The detailed description thereof follows the description of FIG. 2E.

Figure 6B:
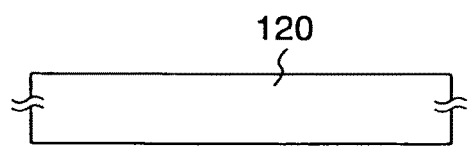

The supporting substrate 120 is prepared (see FIG. 6B). As the supporting substrate 120, the following are given: various glass substrates used in the electronics industry, such as an aluminosilicate glass substrate, an aluminoborosilicate glass substrate, or a barium borosilicate glass substrate; a quartz substrate; a ceramic substrate; a sapphire substrate; a metal substrate whose surface is coated with an insulating film; and the like. Here, a glass substrate is used.

Figure 6C:
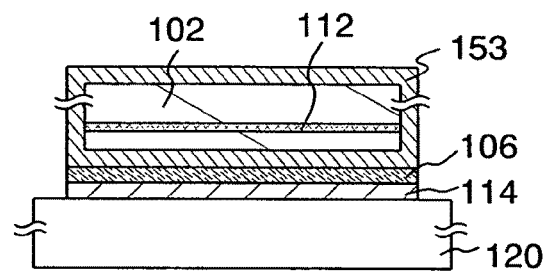

The supporting substrate 120 and the semiconductor substrate 102 are superimposed on each other and bonded to each other with the second thermal oxide film 153, the insulating film 106 containing silicon and nitrogen as its composition, and the bonding layer 114 which are formed over the semiconductor substrate 102 interposed therebetween (see FIG. 6C).

Here, the supporting substrate 120 and the bonding layer 114 formed over the semiconductor substrate 102 are made to face each other to be disposed in contact with each other, whereby a bond is formed. Note that the bonding surfaces which form the bond are sufficiently cleaned. A strong bond by a hydrogen bond can be formed by pressure bonding of the supporting substrate 120 and the semiconductor substrate 102.

Note that activation (including hydrophilization) of one or both of the bonding surfaces may be performed in order to increase the bond strength between the supporting substrate 120 and the semiconductor substrate 102. For an activation method of the bonding surface, there are irradiation with an atomic beam with use of an inert gas or irradiation with an ion beam with use of an inert gas, radical treatment, cleaning treatment with ozone water or the like, and the like. Heat treatment or pressure treatment performed after bonding the supporting substrate 120 and the semiconductor substrate 102 makes it possible to increase the bond strength. Note that when heat treatment is performed, the temperature is set so as not to exceed the temperature for heat treatment for separating the semiconductor substrate, which is performed later.

Next, heat treatment is performed to separate part of the semiconductor substrate 102 at the separation layer 112. The semiconductor substrate 102 is bonded to the supporting substrate 120 with the insulating film interposed therebetween. Thus, the semiconductor film 140 can remain over the supporting substrate 120 by separation of part of the semiconductor substrate 102, whereby an SOI structure is obtained in which the semiconductor film 140 is bonded to the supporting substrate 120 (see FIG. 6D). Note that the flatness of the separation surface of the semiconductor film 140 is damaged, and also a separation layer formed by irradiation with hydrogen ions or deuterium ions remains. Thus, CMP treatment, heat treatment (including irradiation with a laser beam), or the like is desirably performed on the semiconductor film 140 (see FIG. 6E). The descriptions of FIGS. 6D and 6E follow the descriptions of FIGS. 3D and 3E, respectively. Note that, here, since a single-crystal silicon substrate is used as the semiconductor substrate 102, a single-crystal silicon thin film can be obtained as the semiconductor film 140.

Figure 6D:
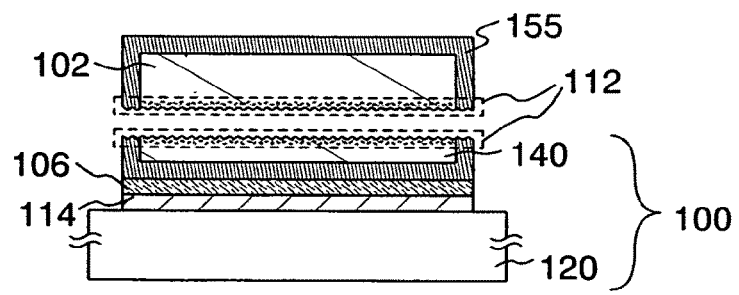
Figure 6E:
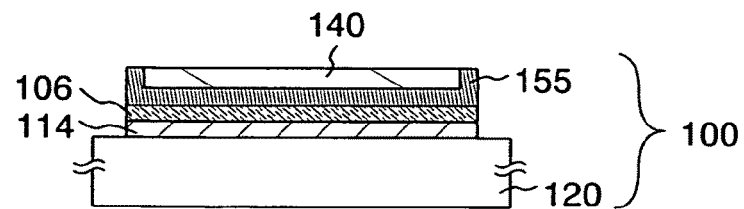

By heat treatment shown in FIG. 6D, halogen contained in the second thermal oxide film 153 is distributed again and diffused to the semiconductor film 140 (the semiconductor substrate 102) side. As a result, dangling bonds at the separation surface of the semiconductor film 140, in the semiconductor film 140, and at an interface between the semiconductor film 140 and the thermal oxide film are terminated. Here, when a single-crystal silicon film is formed as the semiconductor film 140 and the second thermal oxide film 153 contains fluorine, Si—F bonds are generated in regions where dangling bonds are terminated.

Note that, since halogen is diffused from the second thermal oxide film 153 to the semiconductor film 140 by the heat treatment for separating the semiconductor substrate 102, the amount of halogen contained in the second thermal oxide film 153 is decreased. Thus, after the heat treatment, a thermal oxide film 155 (hereinafter, referred to as a third thermal oxide film 155) is obtained which is the second thermal oxide film 153 in which the amount of halogen is decreased. Note that halogen is contained in the third thermal oxide film 155, whereby a gettering effect of metal impurities or the like can be expected.

The semiconductor film 140 is terminated by halogen, and halogen is contained in the semiconductor film 140. Halogen is desirably contained in the semiconductor film 140 at a peak concentration of the range of $1\times10^{17}$ atoms/cm$^3$ to $1\times10^{21}$ atoms/cm$^3$.

Through the above-described steps, a semiconductor device manufacturing substrate can be manufactured in which the semiconductor film 140 is bonded to the supporting substrate 120 with the bonding layer 114, the insulating film 106 containing silicon and nitrogen as its composition, and the third thermal oxide film 155 which are stacked in order over the supporting substrate 120 interposed therebetween.

Note that it is acceptable as long as the method for manufacturing the semiconductor device manufacturing substrate in this embodiment mode enables dangling bonds in the semiconductor film obtained by separation of the semiconductor film by embrittlement by irradiation with ions generated with use of hydrogen as a source gas and heat treatment can be terminated with use of halogen contained in advance in the insulating film formed between the supporting substrate and the semiconductor film, and there is no particular limitation on the order of steps. In this embodiment mode, the example is described in which the insulating film 104 containing silicon and oxygen as its composition (or the thermal oxide film 103) and the insulating film 106 containing silicon and nitrogen as its composition are stacked over the semiconductor substrate 102, the semiconductor substrate 102 is irradiated with hydrogen or deuterium to which ionization has been performed to form the separation layer 112, and then the insulating film 104 containing silicon and oxygen as its composition (or the thermal oxide film 103) is irradiated with halogen ions to form the bonding layer 114 over the insulating film 106 containing silicon and nitrogen as its composition. However, the order of the steps up to formation of the bonding layer 114 over the semiconductor substrate 102 can be changed as appropriate.

For example, the step of forming the separation layer 112 may be performed before the step of forming the insulating film 104 containing silicon and oxygen as its composition and the insulating film 106 containing silicon and nitrogen as its composition over the semiconductor substrate 102 or after the step of forming the insulating film 104 containing silicon and oxygen as its composition and before the step of forming the insulating film 106 containing silicon and nitrogen as its composition. Note that, when the semiconductor substrate 102 is provided with the thermal oxide film 103, the separation layer 112 is desirably formed after the thermal oxide film 103 is formed. This is because the semiconductor substrate 102 can be separated at the separation layer 112 at the time of thermal oxidation. Alternatively, the step of forming the separation layer 112 may be performed after the step of irradiation of the insulating film 104 containing silicon and oxygen as its composition with the halogen ions 113 or after the step of forming the bonding layer 114 over the insulating film 106 containing silicon and nitrogen as its composition. In addition, the step of irradiation with the halogen ions 113 may be performed at least after the step of forming the insulating film 104 containing silicon and oxygen as its composition over the semiconductor substrate 102, and may be performed before the step of forming the insulating film 106 containing silicon and nitrogen as its composition or after the step of forming the bonding layer 114.

For example, after the insulating film 104 containing silicon and oxygen as its composition, the insulating film 106 containing silicon and nitrogen as its composition, and the bonding layer 114 are formed over the semiconductor substrate 102 and the semiconductor substrate 102 is irradiated with the ions 108 which are obtained by ionization of hydrogen or deuterium to form the separation layer 112, the insulating film 104 containing silicon and oxygen as its composition is irradiated with the halogen ions 113 to obtain the insulating film 105 containing silicon and oxygen as its composition in which the halogen are contained. Alternatively, in this case, after formation of the bonding layer 114 and irradiation of the insulating film 104 containing silicon and oxygen as its composition with the halogen ions 113 to obtain the insulating film 105 containing silicon and oxygen as its composition in which the halogen are contained, the separation layer 112 can be formed by irradiation of the semiconductor substrate 102 with the ions 108 which are obtained by ionization of hydrogen or deuterium.

In this embodiment mode, dangling bonds in the semiconductor film included in the semiconductor device manufacturing substrate are terminated by halogen. Thus, improvement of semiconductor characteristics is achieved, and manufacture of a semiconductor device which has good electric characteristics can be realized with use of the semiconductor device manufacturing substrate of this embodiment mode.

Note that this embodiment mode can be combined as appropriate with other embodiment modes described in this specification.

Embodiment Mode 2

In this embodiment mode, an example of manufacturing a semiconductor device with use of a semiconductor device manufacturing substrate of the present invention will be described with reference to FIGS. 11A to 11D and FIGS. 12A and 12B.

Figure 11A:
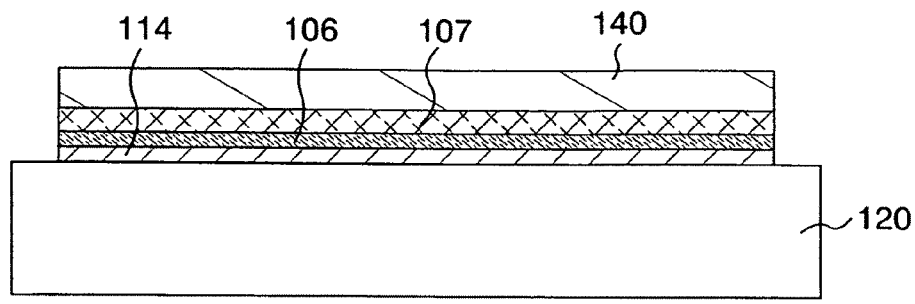
FIGS. 11A to 11D are views illustrating an example of a method for manufacturing a semiconductor device.

A semiconductor device manufacturing substrate is prepared (see FIG. 11A). In this embodiment mode, an example of using the semiconductor device manufacturing substrate which has an SOI structure shown in FIG. 1, in which the semiconductor film 140 is bonded to the supporting substrate 120 with the bonding layer 114, the insulating film 106 containing silicon and nitrogen as its composition, and the third insulating film 107 containing silicon and oxygen as its composition which are stacked in order over the supporting substrate 120 interposed therebetween, is described. Note that there is no particular limitation on the structure of the semiconductor device manufacturing substrate of the present invention, and a semiconductor device manufacturing substrate which has another structure described in this specification can be applied.

A substrate with an insulating surface or a substrate with an insulating property is used as the supporting substrate 120. For example, various glass substrates (also referred to as a non-alkali glass substrate) used in the electronics industry, such as an aluminosilicate glass substrate, an aluminoborosilicate glass substrate, or a barium borosilicate glass substrate; a quartz substrate; a ceramic substrate; a sapphire substrate; a metal substrate whose surface is coated with an insulating film; or the like is used.

A film which has a smooth surface and can form a hydrophilic surface is desirably formed as the bonding layer 114. For example, a silicon oxide film or a film which has siloxane bonds is formed as the bonding layer 114. The insulating film 106 containing silicon and nitrogen as its composition functions as a blocking film. The insulating film 106 containing silicon and nitrogen as its composition may be formed of, for example, a silicon nitride film or a silicon nitride oxide film. The formation of the insulating film 106 containing silicon and nitrogen as its composition makes it possible to block diffusion of metal impurities from the supporting substrate 120 to the semiconductor film 140 side. In addition, the bonding layer 114 is located between the insulating film 106 containing silicon and nitrogen as its composition and the supporting substrate 120, whereby functions are obtained in which bonding layer 114 reduces the internal stress of the insulating film 106 containing silicon and nitrogen as its composition and reduces distortion due to stress by different kinds of materials.

Halogen is contained in the third insulating film 107 containing silicon and oxygen as its composition. As the third insulating film 107 containing silicon and oxygen as its composition, a silicon oxide film or a silicon oxynitride film may be formed. Needless to say, a thermal oxide film may be used as the third insulating film 107 containing silicon and oxygen as its composition. The third insulating film 107 containing silicon and oxygen as its composition contains halogen, whereby it has a gettering effect of metal impurities or the like. In addition, the third insulating film 107 containing silicon and oxygen as its composition is located between the semiconductor film 140 and the insulating film 106 containing silicon and nitrogen as its composition, whereby trap levels can be prevented from being formed at an interface of the semiconductor film 140, and improvement of electric characteristics can be achieved.

Note that the thickness of each of the bonding layer 114, the insulating film 106 containing silicon and nitrogen as its composition, and the third insulating film 107 containing silicon and oxygen as its composition may be determined as appropriate by a practitioner. For example, the bonding layer 114 can be formed to a thickness of greater than or equal to 5 nm and less than or equal to 500 nm, preferably greater than or equal to 10 nm and less than or equal to 100 nm; the insulating film 106 containing silicon and nitrogen as its composition can be formed to a thickness of greater than or equal to 10 nm and less than or equal to 200 nm, preferably greater than or equal to 50 nm and less than or equal to 100 nm; and the third insulating film 107 containing silicon and oxygen as its composition can be formed to a thickness of greater than or equal to 10 nm and less than or equal to 500 nm, preferably greater than or equal to 50 nm and less than or equal to 200 nm.

The semiconductor film 140 is formed to a thickness of greater than or equal to 5 nm and less than or equal to 500 nm, preferably greater than or equal to 10 nm and less than or equal to 200 nm, further preferably greater than or equal to 10 nm and less than or equal to 60 nm. The thickness of the semiconductor film 140 can be set by control of the depth where the separation layer 112 is formed, which is described in the above embodiment mode. In addition, the semiconductor film 140 of the semiconductor device manufacturing substrate may be thinned by etching or the like to a desired thickness. The semiconductor film 140 can be thinned by dry etching with use of a chlorine-based gas such as $Cl_2$, $BCl_3$, or $SiCl_4$; a fluorine-based gas such as $CF_4$, $NF_3$, or $SF_6$; or an HBr gas; or the like. Alternatively, the semiconductor film 140 can be partially altered by oxidation treatment, nitridation treatment, or the like, and the altered portion can be selectively etched.

Halogen is contained in the semiconductor film 140. Halogen is desirably contained in the semiconductor film 140 at a peak concentration of the range of $1\times10^{17}$ atoms/cm$^3$ to $1\times10^{21}$ atoms/cm$^3$. In addition, although halogen contained in the semiconductor film 140 can be uniformly distributed, halogen may be distributed in the semiconductor film 140 so as to have a local peak concentration. When halogen is distributed in the semiconductor film 140 while having a local peak concentration, the peak concentration desirably exists in the vicinity of an interface or on the side close to a separation surface where a dangling bond is easily formed.

In addition, it is desirable to add a p-type impurity element such as boron, aluminum, or gallium, or an n-type impurity element such as phosphorus or arsenic to the semiconductor film 140 in accordance with regions where an n-channel field effect transistor and a p-channel field effect transistor are formed. That is, so-called well regions are formed by addition of a p-type impurity element in accordance with a formation region of an n-channel field effect transistor and addition of an n-type impurity element in accordance with a formation region of a p-channel field effect transistor. The dose of impurity ions may be approximately greater than or equal to $1\times10^{12}$ ions/cm$^2$ and less than or equal to $1\times10^{14}$ ions/cm$^2$. Furthermore, when threshold voltage of the field effect transistor is controlled, a p-type impurity element or an n-type impurity element may be added to these well regions.

Figure 11B:
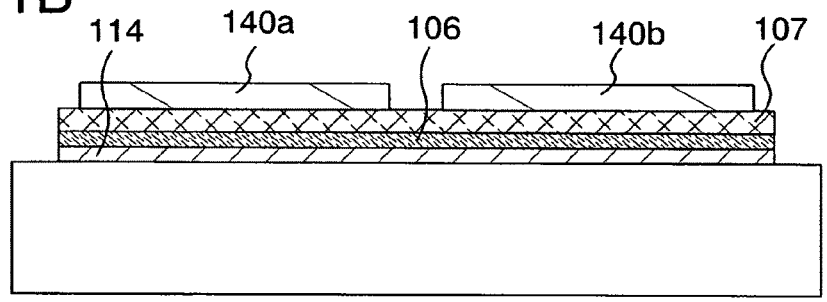
Figure 11C:
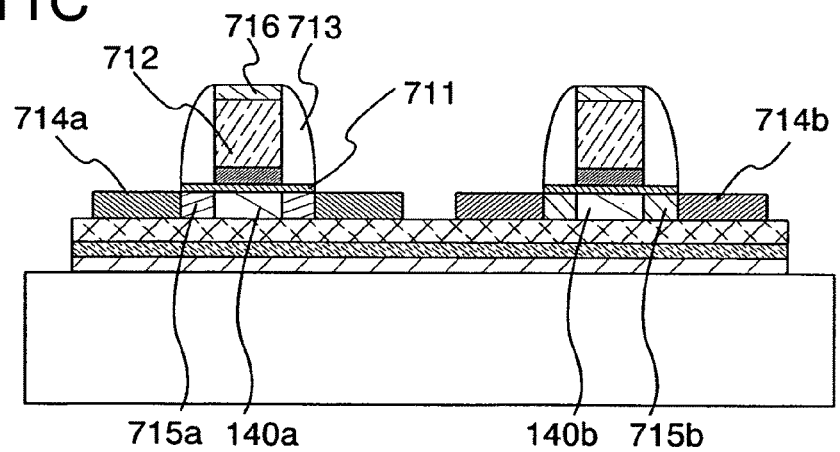

Next, the semiconductor film 140 is selectively etched to form a semiconductor film 140a and a semiconductor film 140b which are separated into island shapes in accordance with arrangement of semiconductor elements (see FIG. 11B).

Note that, although the example in which element isolation is performed by etching of the semiconductor film 140 into the island shape is described in this embodiment mode, the present invention is not particularly limited thereto. For example, element isolation may be performed by embedding of an insulating film between semiconductor films in accordance with arrangement of semiconductor elements.

Next, a gate insulating film 711, a gate electrode 712, and sidewall insulating films 713 are formed over each of the semiconductor film 140a and the semiconductor film 140b. The sidewall insulating films 713 are provided on side surfaces of the gate electrode 712. Then, a first impurity region 714a and a second impurity region 715a are formed in the semiconductor film 140a, and a first impurity region 714b and a second impurity region 715b are formed in the semiconductor film 140b. Note that an insulating film 716 is formed over the gate electrode 712. The insulating film 716 is formed of a silicon nitride film and used as a hard mask for etching when forming the gate electrode 712 (see FIG. 11C).

Note that conductive films for forming the gate insulating film 711, the sidewall insulating films 713, the insulating film 716, and the gate electrode 712 are preferably formed at a temperature less than the temperature of the heat treatment for separating a semiconductor substrate in the semiconductor device manufacturing substrate. This is because halogen which terminates the semiconductor film 140 is prevented from being desorbed.

Figure 11D:
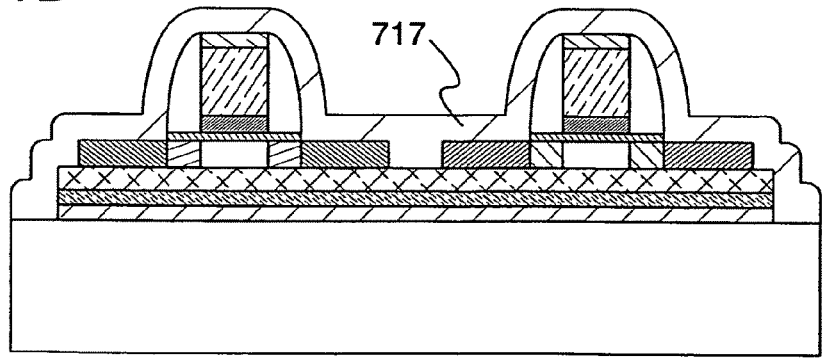
Figure 12A:
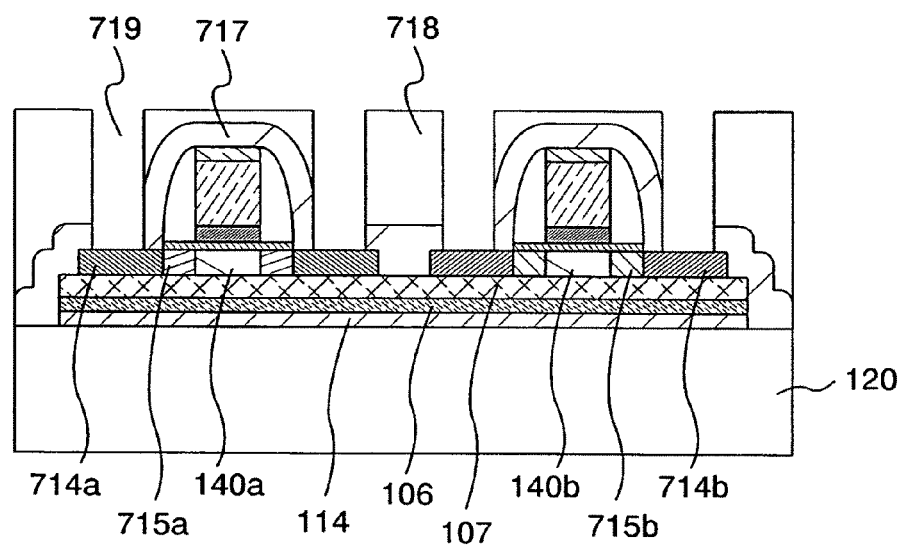
FIGS. 12A and 12B are views each illustrating an example of a method for manufacturing a semiconductor device.
Figure 12B:
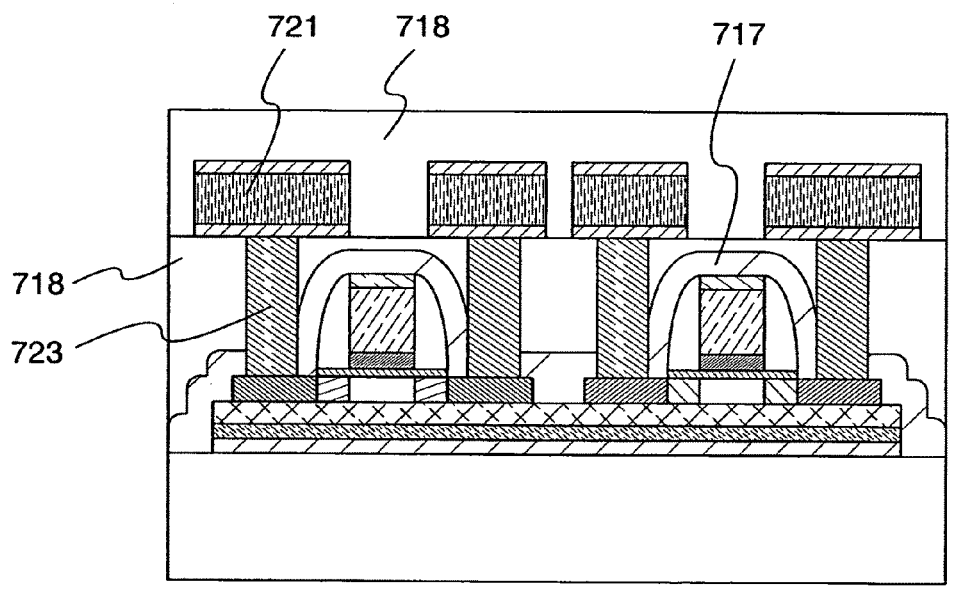

Next, a protective film 717 is formed so as to cover the gate electrodes 712 and the like provided for the semiconductor device manufacturing substrate (see FIG. 11D). The protective film 717 prevents contamination due to metal impurities from the upper layer side, whereas the insulating film 106 containing silicon and nitrogen as its composition prevents diffusion of metal impurities from the supporting substrate 120 side. In this embodiment mode, the lower layer side and the upper layer side of the semiconductor film 140 which has excellent crystallinity are coated with an insulating film having a high blocking effect of metal impurities with high mobility, such as sodium. Thus, a profound effect on improvement of electric characteristics of the semiconductor elements manufactured using the semiconductor film 140 can be achieved.

An interlayer insulating film 718 is formed over the protective film 717. The interlayer insulating film 718 may be formed of a BPSG (boron phosphorus silicon glass) film or may be formed by application of an organic resin typified by polyimide. Then, contact holes 719 are formed in the interlayer insulating film 718. Note that the protective film 717 and the interlayer insulating film 718 are formed at a temperature less than the temperature of the heat treatment for separating the semiconductor substrate in the semiconductor device manufacturing substrate in order to prevent desorption of halogen in the semiconductor film 140.

Next, a step of forming wirings is described. Contact plugs 723 are formed in the contact holes 719. The contact plugs 723 are formed in such a manner that tungsten silicide is formed by a CVD method with use of a $WF_6$ gas and a $SiH_4$ gas and embedded in the contact holes 719. Alternatively, tungsten may be formed by hydrogen reduction of $WF_6$ and embedded in the contact holes 719. After that, wirings 721 are formed in accordance with the contact plugs 723. The wirings 721 are formed of aluminum or an aluminum alloy, and upper layers and lower layers of the wirings 721 are formed of a metal film of molybdenum, chromium, or titanium as barrier metal. Furthermore, another interlayer insulating film 718 is formed over the upper layers of the wirings 721 (see FIG. 12B). The wirings may be provided as appropriate, and multilayer wirings may be formed by further formation of wiring layers over the upper layers. In that case, a damascene process may be employed.

Note that the processing temperature of the formation of the wirings or the like is set to less than the temperature of the heat treatment for separating the semiconductor substrate in the semiconductor device manufacturing substrate in order to prevent desorption of halogen in the semiconductor film 140. As described above, the temperature of the heat treatment for separating the semiconductor substrate is set as the highest temperature of the process and the processing temperatures of other steps are set to less than the temperature of the heat treatment, whereby desorption of halogen which terminates dangling bonds in the semiconductor film 140 can be prevented.

Through the above-described steps, a field effect transistor can be manufactured with use of the semiconductor device manufacturing substrate which has the semiconductor film bonded to the supporting substrate with a stacked structure of the insulating films interposed therebetween. Improvement in electric characteristics of the semiconductor device manufacturing substrate of the present invention is achieved, and thus a field effect transistor which has good operating characteristics can be provided. In addition, an insulating film containing silicon and oxygen as its composition in which halogen is contained and an insulating film containing silicon and nitrogen as its composition each of which has a high gettering effect of metal impurities or a high blocking effect thereof is formed, and thus a semiconductor device with high reliability can be manufactured. Furthermore, application of the present invention makes it possible to form the semiconductor film 140 using a single-crystal semiconductor, and thus higher performance of the semiconductor device can be achieved.

Note that this embodiment mode can be combined as appropriate with other embodiment modes described in this specification.

Embodiment Mode 3

In this embodiment mode, an example of manufacturing a semiconductor device with use of a semiconductor device manufacturing substrate of the present invention will be described with reference to FIGS. 7A to 7E, FIGS. 8A to 8C, FIGS. 9A and 9B, and FIGS. 10A and 10B. In this embodiment mode, an example of manufacturing an electroluminescence (EL) display device will be described.

Figure 7A:
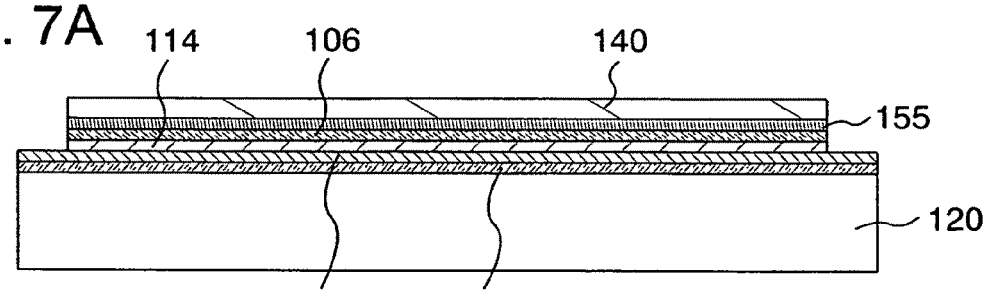
FIGS. 7A to 7E are views illustrating an example of a method for manufacturing an electroluminescence display device.

A semiconductor device manufacturing substrate is prepared (see FIG. 7A). In this embodiment mode, an example of using a semiconductor device manufacturing substrate which has an SOI structure in which the semiconductor film 140 is bonded to the supporting substrate 120 with the barrier film 122, the bonding layer 124, the bonding layer 114, the insulating film 106 containing silicon and nitrogen as its composition, and the third thermal oxide film 155 which are stacked in order over the supporting substrate 120 interposed therebetween is described. The semiconductor device manufacturing substrate described in this embodiment mode is an example in which the bonding layer is also provided over the supporting substrate in the structure shown in FIGS. 6A to 6E. That is, the structure of the supporting substrate shown in FIG. 4B is employed. Note that the present invention is not particularly limited thereto, and a semiconductor device manufacturing substrate which has another structure described in this specification can also be employed.

A substrate with an insulating surface or a substrate with an insulating property is used as the supporting substrate 120. For example, various glass substrates (also referred to as a non-alkali glass substrate) used in the electronics industry, such as an aluminosilicate glass substrate, an aluminoborosilicate glass substrate, or a barium borosilicate glass substrate; a quartz substrate; a ceramic substrate; a sapphire substrate; a metal substrate whose surface is coated with an insulating film; or the like is used.

A film which has a smooth surface and can form a hydrophilic surface is formed as the bonding layer 114 and the bonding layer 124. For example, a silicon oxide film or a film which has siloxane bonds is formed. Note that the bonding layer 124 is needed to form in consideration of the heat resistance of the supporting substrate 120. When a glass substrate is used as the supporting substrate 120, the bonding layer 124 is formed at a temperature of less than or equal to 650° C. For example, the bonding layer 124 can be formed by a CVD method with use of organic silane such as TEOS as a source gas. As the barrier film 122 provided between the supporting substrate 120 and the bonding layer 124, a film which has an effect of blocking metal impurities, such as a silicon nitride film, a silicon nitride oxide film, or an aluminum nitride film is formed. Note that, in the case where the bonding layer 124 and the barrier film 122 are formed over the supporting substrate 120, the barrier film 122 is formed as a bottom layer (on the supporting substrate 120 side) and the bonding layer 124 is formed as an upper layer (the semiconductor film 140 side), whereby internal stress of the barrier film 122 can be reduced. The insulating film 106 containing silicon and nitrogen as its composition may be formed of a silicon nitride film or a silicon nitride oxide film.

The third thermal oxide film 155 is formed by thermal oxidation of the semiconductor substrate. In addition, halogen is contained in the third thermal oxide film 155.

Note that the thickness of each of the barrier film 122, the bonding layer 124, the bonding layer 114, the insulating film 106 containing silicon and nitrogen as its composition, and the third thermal oxide film 155 may be determined as appropriate by a practitioner. The thickness of the third thermal oxide film 155 can be controlled by processing time or the like of the thermal oxidation.

The semiconductor film 140 is formed to a thickness of greater than or equal to 5 nm and less than or equal to 500 nm, preferably greater than or equal to 10 nm and less than or equal to 200 nm, further preferably greater than or equal to 10 nm and less than or equal to 60 nm. The thickness of the semiconductor film 140 can be set by control of the depth where the separation layer 112 is formed, which is described in the above embodiment mode. In addition, the semiconductor film 140 of the semiconductor device manufacturing substrate may be thinned by etching or the like to a desired thickness. The semiconductor film 140 can be thinned by dry etching with use of a chlorine-based gas such as $Cl_2$, $BCl_3$, or $SiCl_4$; a fluorine-based gas such as $CF_4$, $NF_3$, or $SF_6$; or an HBr gas; or the like. Alternatively, the semiconductor film 140 can be partially altered by oxidation treatment, nitridation treatment, or the like and the altered portion can be selectively etched.

Halogen is contained in the semiconductor film 140. Halogen is desirably contained in the semiconductor film 140 at a peak concentration of the range of $1 \times 10^{17}$ atoms/cm$^3$ to $1 \times 10^{21}$ atoms/cm$^3$. In addition, although halogen contained in the semiconductor film 140 can be uniformly distributed, halogen may be distributed in the semiconductor film 140 so as to locally have a peak concentration. When halogen is distributed in the semiconductor film 140 while having a local peak concentration, the peak concentration desirably exists in the vicinity of an interface or on the side close to a separation surface where a dangling bond is easily formed. It is desirable to add a p-type impurity element such as boron, aluminum, or gallium, or an n-type impurity element such as phosphorus or arsenic to the semiconductor film 140 in accordance with regions where field effect transistor are formed. That is, so-called well regions are formed by addition of a p-type impurity element in accordance with a formation region of an n-channel field effect transistor and addition of an n-type impurity element in accordance with a formation region of a p-channel field effect transistor. The dose of impurity ions may be approximately greater than or equal to $1 \times 10^{12}$ ions/cm$^2$ and less than or equal to $1 \times 10^{14}$ ions/cm$^2$. Furthermore, when threshold voltage of a field effect transistor is controlled, a p-type impurity element or an n-type impurity element may be added to these well regions.

Figure 7B:
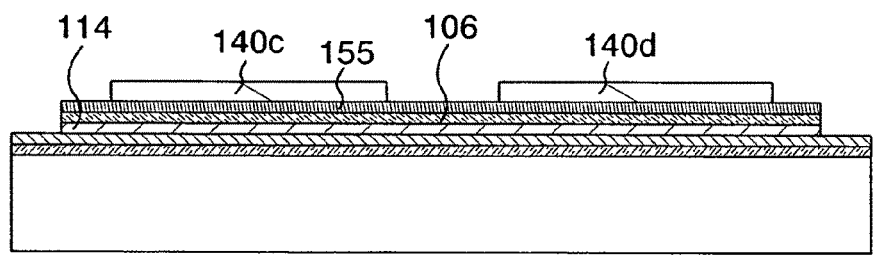

Next, the semiconductor film 140 is selectively etched to form a semiconductor film 140c and a semiconductor film 140d which are separated into island shapes in accordance with arrangement of semiconductor elements (see FIG. 7B).

Figure 7C:
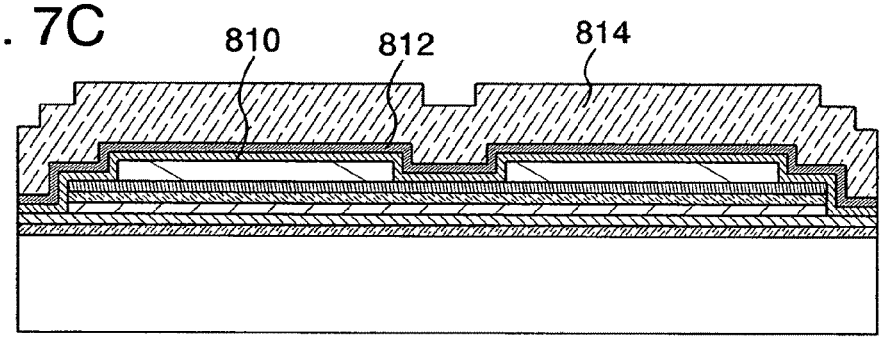

Next, a gate insulating film 810, and a first conductive film 812 and a second conductive film 814 which form a gate electrode are formed in order over the semiconductor film 140c and the semiconductor film 140d (see FIG. 7C).

The gate insulating film 810 is formed as a single-layer film or a stacked-layer film using an insulating film such as a silicon oxide film, a silicon oxynitride film, a silicon nitride film, or a silicon nitride oxide film by a CVD method, a sputtering method, an atomic layer epitaxy method, or the like.

Alternatively, the gate insulating film 810 may be formed in such a manner that plasma treatment is performed on the semiconductor film 140c and the semiconductor film 140d to oxidize or nitride surfaces thereof. The plasma treatment in this case includes plasma treatment using plasma excited by a microwave (a typical frequency of 2.45 GHz), for example, treatment using plasma which is excited by a microwave and has an electron density of greater than or equal to $1 \times 10^{11}$ cm$^3$ and less than or equal to $1 \times 10^{13}$ cm$^3$ and an electron temperature of greater than or equal to 0.5 eV and less than or equal to 1.5 eV. Oxidation treatment or nitridation treatment of the surface of the semiconductor film with such plasma treatment makes it possible to form a thin and dense film. In addition, the surface of the semiconductor film is directly oxidized, and thus a film which has good interface characteristics can be obtained. Note that the gate insulating film 810 may be formed in such a manner that plasma treatment using a microwave is performed on a film formed by a CVD method, a sputtering method, or an atomic layer epitaxy method.

Note that, since the gate insulating film 810 forms an interface with the semiconductor film, the gate insulating film 810 on the side which is in contact with the semiconductor film is desirably formed of a silicon oxide film or a silicon oxynitride film. This is because, if a film in which the amount of nitrogen is higher than that of oxygen, such as a silicon nitride film or a silicon nitride oxide film is formed, problems of surface characteristics such as generation of a fixed charge due to formation of trap levels might be generated.

The conductive film which forms the gate electrode is formed as a single-layer film or a stacked-layer film using an element selected from tantalum, tantalum nitride, tungsten, titanium, molybdenum, aluminum, copper, chromium, or niobium, an alloy material or a compound material containing the element as its main component, or a semiconductor material typified by polycrystalline silicon doped with an impurity element such as phosphorus, by a CVD method or a sputtering method. When the conductive film is formed as a stacked film, it can be formed using different conductive materials or can be formed using the same conductive material. In this embodiment mode, the example is described in which the first conductive film 812 and the second conductive film 814 are used as the conductive film which forms the gate electrode.

When the conductive film which forms the gate electrode has a two-layer structure of the first conductive film 812 and the second conductive film 814, for example, a stacked film of a tantalum nitride film and a tungsten film, a stacked film of a tungsten nitride film and a tungsten film, or a stacked film of a molybdenum nitride film and a molybdenum film can be formed. Note that a stacked film of a tantalum nitride film and a tungsten film is preferable because etching rates of both films are easily differentiated from each other and high selectivity can be obtained. Note that, in for the two-layer films which are exemplified, the first mentioned film is preferably formed over the gate insulating film 810. Here, the first conductive film 812 is formed to a thickness of greater than or equal to 20 nm and less than or equal to 100 nm. The second conductive film 814 is formed to a thickness of greater than or equal to 100 nm and less than or equal to 400 nm. Note that the gate electrode can have a stacked structure of three or more layers. In that case, a stacked structure of a molybdenum film, an aluminum film, a molybdenum film may be employed.

Note that the gate insulating film 810, and the first conductive film 812 and the second conductive film 814 which form the gate electrode are desirably formed at a temperature less than or equal to the temperature of the heat treatment for separating the semiconductor substrate, in order to prevent desorption of halogen which terminates the semiconductor film 140.

Next, a resist mask 820c and a resist mask 820d are selectively formed over the second conductive film 814. Then, first etching treatment and second etching treatment are performed using the resist mask 820c and the resist mask 820d.

Figure 7D:
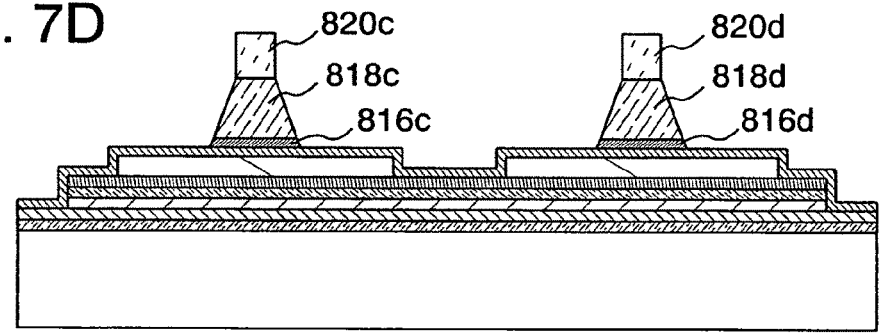

First, the first conductive film 812 and the second conductive film 814 are selectively etched by the first etching treatment to form a first conductive film 816c and a second conductive film 818c over the semiconductor film 140c, and to form a first conductive film 816d and a second conductive film 818d over the semiconductor film 140d (see FIG. 7D).

Figure 7E:
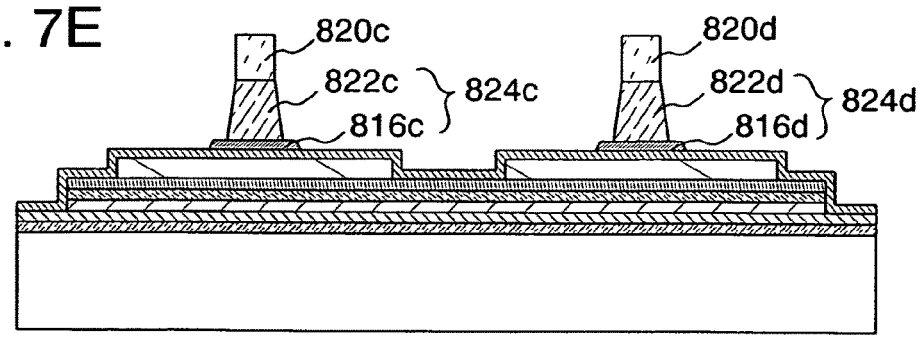
Figure 8A:
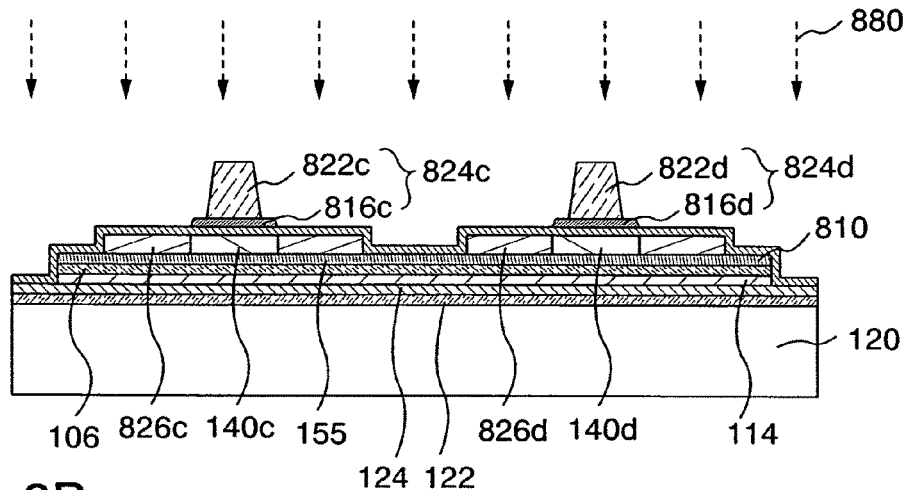
FIGS. 8A to 8C are views illustrating an example of a method for manufacturing an electroluminescence display device.
Figure 8B:
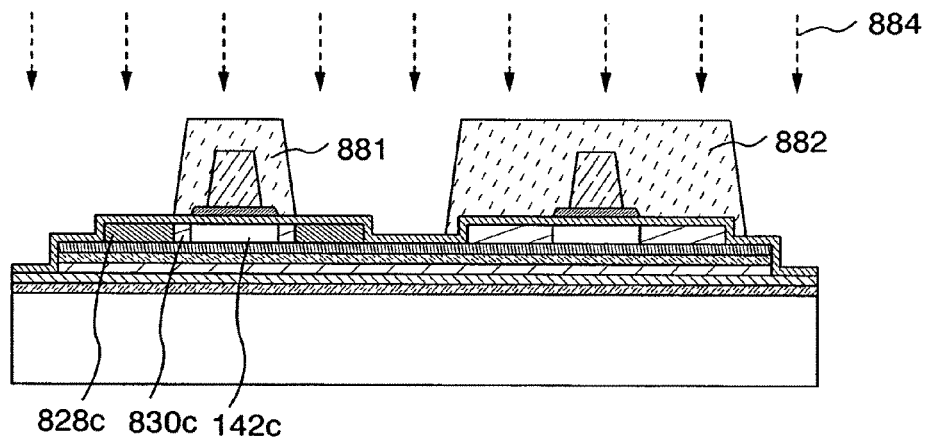
Figure 8C:
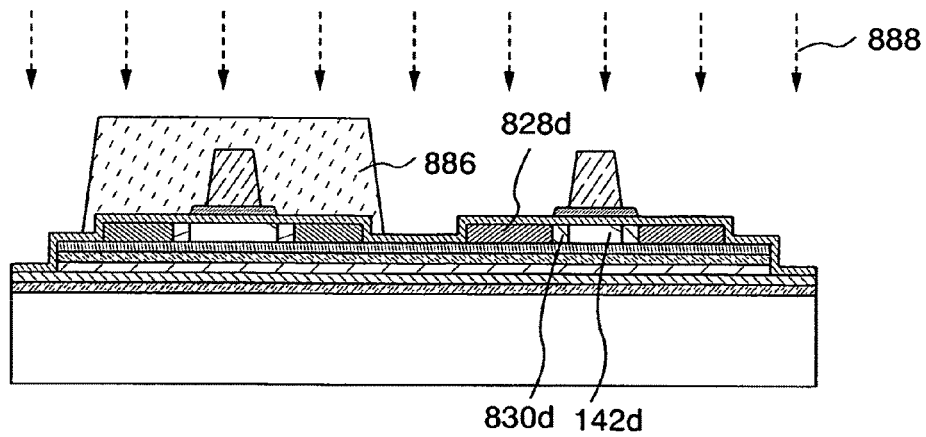

Next, edge portions of the second conductive film 818c and the second conductive film 818d are selectively etched by the second etching treatment to form a second conductive film 822c and a second conductive film 822d (see FIG. 7E). Note that the second conductive film 822c and the second conductive film 822d are formed so that the widths (the lengths in a direction parallel to a direction in which carriers flow in a channel formation region (a direction connecting a source region and a drain region)) of the second conductive film 822c and the second conductive film 822d are smaller than the widths of the first conductive film 816c and the first conductive film 816d, respectively. In this manner, a gate electrode 824c formed of the first conductive film 816c and the second conductive film 822c, and a gate electrode 824d formed of the first conductive film 816d and the second conductive film 822d can be obtained.

Although an etching method employed for the first etching treatment and the second etching treatment may be selected as appropriate, a dry etching apparatus using a high-density plasma source such as ECR (electron cyclotron resonance) or ICP (inductive coupled plasma) may be used in order to increase the etching rate. Etching conditions of the first etching treatment and the second etching treatment are controlled as appropriate, whereby side surfaces of the first conductive films 816c and 816d and the second conductive films 822c and 822d can be formed into predetermined tapered shapes. The resist masks 820c and 820d may be removed after the desired gate electrodes 824c and 824d are formed.

Next, an impurity element 880 is added to the semiconductor film 140c and the semiconductor film 140d with use of the gate electrode 824c and the gate electrode 824d as masks, respectively. In the semiconductor film 140c, a pair of first impurity regions 826c is formed in a self-alignment manner with use of the first conductive film 816c and the second conductive film 822c as masks. In addition, in the semiconductor film 140d, a pair of first impurity regions 826d is formed in a self-alignment manner with use of the first conductive film 816d and the second conductive film 822d as masks (see FIG. 8A).

As the impurity element 880, a p-type impurity element such as boron, aluminum, or gallium, or an n-type impurity element such as phosphorus or arsenic is added. Here, phosphorus that is an n-type impurity element is added so as to be contained at a concentration of about greater than or equal to $1\times10^{17}$ atoms/cm$^3$ and less than or equal to $5\times10^{18}$ atoms/cm$^3$.

Next, a resist mask 882 is selectively formed so as to cover the semiconductor film 140*d*. In addition, a resist mask 881 is formed so as to partially cover the semiconductor film 140*c*. Then, an impurity element 884 is added with use of the resist mask 882 and the resist mask 881 as masks to form a pair of second impurity regions 828*c*, a pair of third impurity regions 830*c*, and a channel formation region 142*c* in the semiconductor film 140*c* (see FIG. 8B).

As the impurity element 884, a p-type impurity element such as boron, aluminum, or gallium, or an n-type impurity element such as phosphorus or arsenic is added. Here, phosphorus that is an n-type impurity element is added so as to be contained at a concentration of about greater than or equal to $5\times10^{19}$ atoms/cm$^3$ and less than or equal to $5\times10^{20}$ atoms/cm$^3$.

In the semiconductor film 140*c*, the second impurity regions 828*c* are formed in regions which do not overlap with the first conductive film 816*c* and the second conductive film 822*c*. The channel formation region 142*c* is formed in a region which overlaps with the first conductive film 816*c* and the second conducive film 822*c*. The third impurity regions 830*c* are each formed between the channel formation region 142*c* and the second impurity region 828*c* and formed in a region which does not overlap with the first conductive film 816*c* and the second conducive film 822*c*. In addition, the third impurity regions 830*c* are formed in regions which do not overlap with the first conductive film 816*c* and the second conducive film 822*c* and in regions which overlap with the resist mask 881. The second impurity regions 828*c* function as a source region and a drain region. In addition, the third impurity regions 830*c* function as LDD regions. In this embodiment mode, the impurity concentration of the second impurity region 828*c* is higher than that of the third impurity region 830*c*.

Note that an LDD region refers to a region to which an impurity element is added at low concentration between a channel formation region and a source region or a drain region which is formed by being added with an impurity element at high concentration. When an LDD region is provided, there is an advantageous effect in that an electric field in the vicinity of a drain region is reduced to prevent deterioration due to hot carrier injection. In order to prevent deterioration of on current due to hot carriers, a structure (also referred to as a GOLD (gate-drain overlapped LDD) structure) may be employed in which an LDD region overlaps with a gate electrode with a gate insulating film interposed therebetween.

Next, the resist mask 881 and the resist mask 882 are removed, and then a resist mask 886 is formed so as to cover the semiconductor film 140*c*. Then, an impurity element 888 is added with use of the resist mask 886, the first conductive film 816*d*, and the second conductive film 822*d* as masks to form a pair of second impurity regions 828*d*, a pair of third impurity region 830*d*, and a channel formation region 142*d* in the semiconductor film 140*d* (see FIG. 8C).

As the impurity element 888, a p-type impurity element such as boron, aluminum, or gallium, or an n-type impurity element such as phosphorus or arsenic is added. Here, boron that is a p-type impurity region is added so as to be contained at a concentration of about greater than or equal to $1\times10^{20}$ atoms/cm$^3$ and less than or equal to $5\times10^{21}$ atoms/cm$^3$.

In the semiconductor film 140*d*, the second impurity regions 828*d* are formed in regions which do not overlap with the first conductive film 816*d* and the second conductive film 822*d*. The third impurity regions 830*d* are formed in regions which overlap with the first conductive film 816*d* and do not overlap with the second conductive film 822*d*. The impurity element 888 penetrates the first conductive film 816*d* to form the third impurity regions 830*d*. The second impurity regions 828*d* function as a source region and a drain region. In addition, the third impurity regions 830*d* function as LDD regions. In this embodiment mode, the impurity concentration of the second impurity region 828*d* is higher than that of the third impurity region 830*d*.

Next, an interlayer insulating film is formed. Although the interlayer insulating film can be formed as either a single-layer film or a stacked-layer film, it is formed so as to have a stacked structure of an insulating film 832 and an insulating film 834 in this embodiment mode (see FIG. 9A).

As the interlayer insulating film, a silicon oxide film, a silicon oxynitride film, a silicon nitride film, a silicon nitride oxide film, or the like can be formed by a CVD method or a sputtering method. Alternatively, the interlayer insulating film can be formed using an organic material such as polyimide, polyamide, polyvinyl phenol, benzocyclobutene, acrylic, or epoxy; a siloxane material such as a siloxane resin; an oxazole resin; or the like by an application method such as a spin coating method. Note that a siloxane material corresponds to a material which has a Si—O—Si bond. Siloxane includes a skeleton structure of a bond of silicon (Si) and oxygen (O). As a substituent, an organic group containing at least hydrogen (e.g., an alkyl group or aromatic hydrocarbon) is used. Alternatively, a fluoro group can be used as a substituent. Further alternatively, a fluoro group and an organic group containing at least hydrogen can be used as a substituent. An oxazole resin is, for example, photosensitive polybenzoxazole or the like. Photosensitive polybenzoxazole is a material which has a low dielectric constant (a dielectric constant of 2.9 at 1 MHz at room temperature), high heat resistance (according to results of thermogravimetry-differential thermal analysis (TG-DTA), it has a thermal decomposition temperature of 550° C. at a rate of temperature increase of 5° C./min), and a low water absorption coefficient (0.3% at room temperature for 24 hours). Since an oxazole resin has a lower dielectric constant (about 2.9) than a dielectric constant of polyimide or the like (approximately 3.2 to 3.4). Thus, when an oxazole resin is used, generation of parasitic capacitance can be suppressed and high-speed operation is possible.

For example, a silicon nitride oxide film is formed to a thickness of 100 nm as the insulating film 832, and a silicon oxynitride film is formed to a thickness of 900 nm as the insulating film 834. In addition, the insulating film 832 and the insulating film 834 are successively formed by a plasma CVD method. Note that the interlayer insulating film can also have a stacked structure of three or more layers. Alternatively, a stacked structure of a silicon oxide film, a silicon oxynitride film, or a silicon nitride film and an insulating film formed using an organic material such as polyimide, polyamide, polyvinyl phenol, benzocyclobutene, acrylic, or epoxy; a siloxane material such as a siloxane resin; or an oxazole resin can be employed.

Note that, in order to prevent desorption of halogen which terminates dangling bonds in the semiconductor film 140, the interlayer insulating film (in this embodiment mode, the insulating film 832 and the insulating film 834) is desirably formed at a temperature less than the temperature of the heat treatment for separating the semiconductor substrate.

Figure 9A:
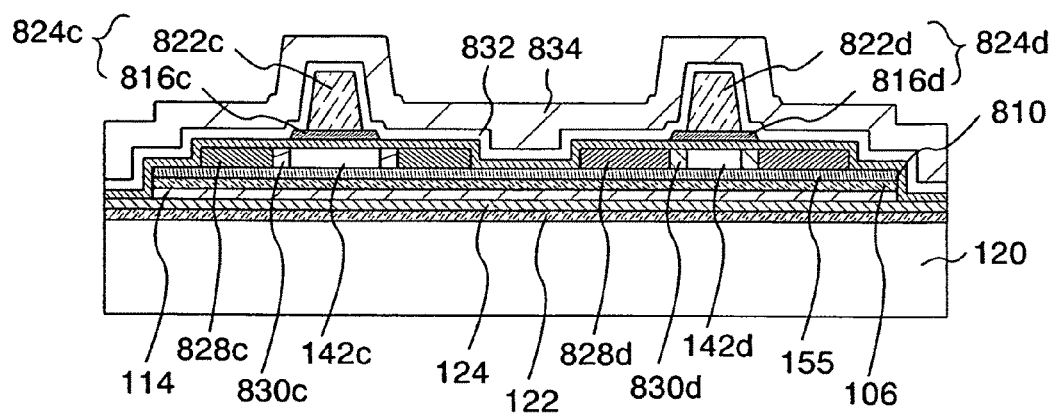
FIGS. 9A and 9B are views illustrating an example of a method for manufacturing an electroluminescence display device.
Figure 9B:
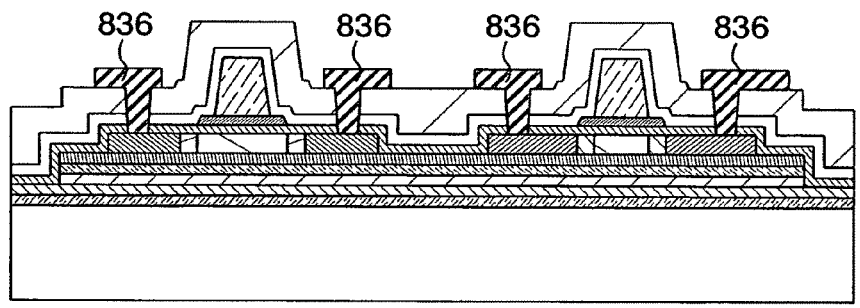

Next, contact holes are formed in the interlayer insulating film (in this embodiment mode, the insulating film 832 and the insulating film 834), and conductive films 836 which function as a source electrode and a drain electrode are formed in the contact holes (see FIG. 9B).

The contact holes are selectively formed in the insulating film 832 and the insulating film 834 so as to reach the second impurity regions 828c formed in the semiconductor film 140c and the second impurity regions 828d formed in the semiconductor film 140d.

As the conductive film 836, a single-layer film or a stacked-layer film formed of one element selected from aluminum, tungsten, titanium, tantalum, molybdenum, nickel, or neodymium or formed of an alloy containing a plurality of the above-described elements can be used. For example, as a conductive film formed of an alloy containing a plurality of the above-described elements, an aluminum alloy containing titanium, an aluminum alloy containing neodymium, or the like can be used. Furthermore, in the case of a stacked film, for example, a structure can be employed in which an aluminum film or an aluminum alloy film as described above is interposed between titanium films.

Figure 10A:
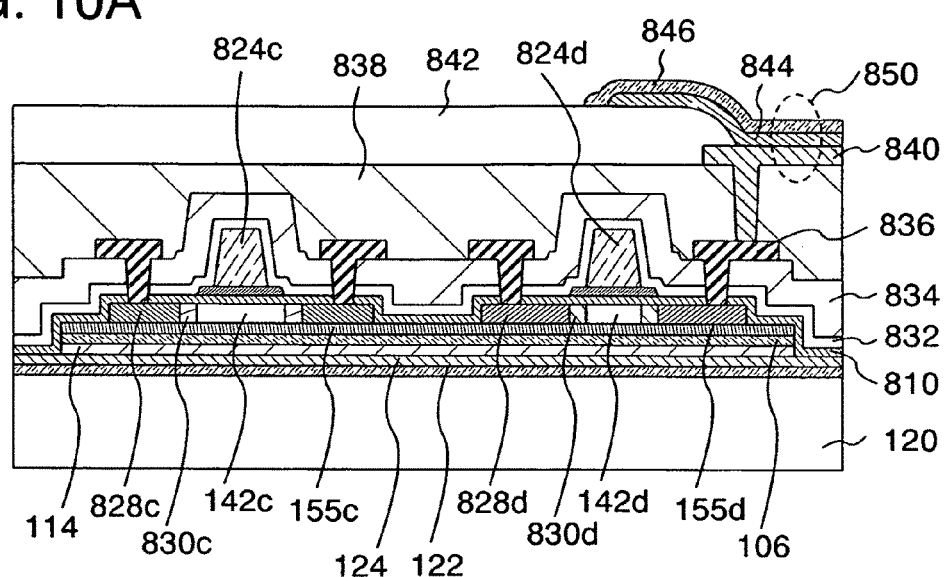
FIGS. 10A and 10B are views illustrating an example of a method for manufacturing an electroluminescence display device.

Next, a step of forming a light-emitting element 850 is described (see FIG. 10A). Here, an example of forming an organic light-emitting element provided with an organic compound-containing layer as a light-emitting layer is described.

First, a pixel electrode 840 is formed so as to be electrically connected to the conductive film 836. The pixel electrode 840 is electrically connected to the second impurity region 828d formed in the semiconductor film 140d with the conductive film 836 interposed therebetween. After a partition film 842 which covers an edge portion of the pixel electrode 840 is formed, an organic compound-containing layer 844 and a counter electrode 846 are stacked over the pixel electrode 840.

Note that, although the example in which the pixel electrode 840 is formed over an insulating film 838 provided over the conductive films 836 is described here, the present invention is not particularly limited thereto. For example, a structure may also be employed in which the pixel electrode 840 is provided over the insulating film 834. In that case, the pixel electrode 840 can also be formed using part of the conductive film 836 which functions as a source electrode or a drain electrode.

As the insulating film 838, a silicon oxide film, a silicon oxynitride film, a silicon nitride film, or the like can be formed by a CVD method or a sputtering method. Alternatively, the insulating film 838 can be formed using an organic material such as polyimide, polyamide, polyvinyl phenol, benzocyclobutene, acrylic, or epoxy; a siloxane material such as a siloxane resin; an oxazole resin; or the like by an application method such as a spin coating method. Note that the insulating film 838 can be formed as a single-layer film or a stacked-layer film using the above-described material.

Either one of the pixel electrode 840 and the counter electrode 846 functions as an anode, and the other functions as a cathode. As for light emission of the light-emitting element, there are the case where light is extracted from the supporting substrate 120 side (also referred to as bottom emission), the case where light is extracted from the side opposite to the supporting substrate 120 side (also referred to as top emission), and the case where light is extracted from the supporting substrate 120 side and the side opposite thereto (also referred to as dual emission). In the case of bottom emission, it is desirable that the pixel electrode 840 be formed as a light-transmitting electrode and the counter electrode 846 as a reflective electrode. In the case of top emission, on the other hand, it is desirable that the pixel electrode 840 be formed as a reflective electrode and the counter electrode as a light-transmitting electrode. In the case of dual emission, it is desirable that both the pixel electrode 840 and the counter electrode 846 be formed as light-transmitting electrodes.

When the pixel electrode 840 or the counter electrode 846 is formed as a reflective electrode, it can be formed using a reflective conductive material, for example, a metal element such as tantalum, tungsten, titanium, molybdenum, aluminum, chromium, or silver, or an alloy material or a compound material containing the above-described metal element.

When the pixel electrode 840 or the counter electrode 846 is formed as a light-transmitting electrode, it can be formed using a light-transmitting conductive material such as indium tin oxide (ITO), zinc oxide (ZnO), indium zinc oxide (IZO), or zinc oxide doped with gallium (GZO). In addition, an electrode through which visible light is transmitted can be obtained by formation of a film of a reflective conductive material to a thickness of several to several tens of nanometers.

A light-transmitting electrode can be formed using a conductive composition containing a conductive high molecule (also referred to as a conductive polymer). A thin film of an electrode formed using a conductive composition desirably has a sheet resistance of less than or equal to 10000 Ω/square and a light transmittance of greater than or equal to 70% at a wavelength of 550 nm. In addition, the resistance of the conductive high molecule which is contained in the conductive composition is desirably less than or equal to 0.1 Ω·cm.

As a conductive high molecule, a so-called π electron conjugated high molecule can be used. For example, polyaniline or a derivative thereof, polypyrrole or a derivative thereof, polythiophene or a derivative thereof, and a copolymer of two or more kinds of those materials can be given.

As specific examples of a conjugated conductive high molecule, the following are given: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

Any of the above-described conductive high molecules may be used alone as a conductive composition to form a light-transmitting electrode. Alternatively, an organic resin can be added to any of the above-described conductive high molecules in order to adjust film characteristics such as film quality or intensity of a light-transmitting electrode formed of a conductive composition.

As an organic resin, a thermosetting resin, a thermoplastic resin, or a photocurable resin which is compatible with a conductive high molecule or can be mixed and dispersed into a conductive high molecule can be used. As examples of such a resin, the following can be given: a polyester-based resin such as polyethylene terephthalate, polybutylene terephthalate, or polyethylene naphthalate; a polyimide-based resin such as polyimide or polyamide imide; a polyamide resin such as polyamide 6, polyamide 66, polyamide 12, or polyamide 11; a fluorine resin such as poly(vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin; a melamine resin; a phenol-based resin; polyether; an acrylic-based resin, or a copolymer of any of those resins.

Furthermore, in order to adjust electric conductivity of a conductive composition, the conductive composition may be doped with an acceptor dopant or a donor dopant so that oxidation-reduction potential of a conjugated electron in a conjugated conductive high molecule may be changed.

A halogen compound, a Lewis acid, a protonic acid, an organic cyano compound, an organic metal compound, or the like can be used as an acceptor dopant. As examples of a halogen compound, there are chlorine, bromine, iodine, iodine chloride, iodine bromide, and iodine fluoride. As examples of a Lewis acid, there are phosphorus pentafluoride, arsenic pentafluoride, antimony pentafluoride, boron trifluoride, boron trichloride, and boron tribromide. As examples of a protonic acid, there are an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As organic carboxylic acid and organic sulfonic acid, the above-described organic carboxylic acid compound and an organic sulfonic acid compound can be used. As an organic cyano compound, a compound having two or more cyano groups in a conjugated bonding, for example, tetracyanoethylene, tetracyanoethylene oxide, tetracyanobenzene, tetracyanoquinodimethane, tetracyanoazanaphthalene, and the like are given.

As a donor dopant, alkali metal, alkaline earth metal, a quaternary amine compound, or the like can be given.

Alternatively, a conductive composition is dissolved in water or an organic solvent (e.g., an alcohol-based solvent, a ketone-based solvent, an ester-based solvent, a hydrocarbon-based solvent, an aromatic-based solvent) and a wet process is used, whereby a thin film which serves as a light-transmitting electrode layer can be formed.

There is no particular limitation on a solvent which dissolves a conductive composition. A solvent which dissolves the above-described conductive high molecules and high molecular resin compounds such as an organic resin may be used. For example, a conductive composition may be dissolved in any one or a mixture of water, methanol, ethanol, propylene carbonate, N-methylpyrrolidone, dimethylformamide, dimethylacetamide, cyclohexanone, acetone, methyl ethyl ketone, methyl isobutyl ketone, toluene, or the like.

After a conductive composition is dissolved in a solvent as described above, a film thereof is formed over the insulating film 838 by a wet process such as an application method, a coating method, a droplet discharge method (also referred to as an inkjet method), or a printing method, whereby the pixel electrode 840 can be obtained. The solvent may be dried with heat treatment or may be dried under reduced pressure. In the case where an organic resin is a thermosetting resin, heat treatment may be performed. In the case where an organic resin is a photocurable resin, light irradiation treatment may be performed.

The partition film 842 can be formed in such a manner that an insulating film is formed over the entire surface of the substrate by a CVD method, a sputtering method, an application method, or the like and then the insulating film is selectively etched. Alternatively, the partition film 842 can be formed selectively by a droplet discharge method, a printing method, or the like. Further alternatively, an insulating film is formed using a positive photosensitive resin over the entire surface, and then the insulating film is exposed to light and developed, whereby the partition film 842 having a desired shape can be formed.

As the organic compound-containing layer 844, at least a light-emitting layer is formed, and a hole injecting layer, a hole transporting layer, an electron transporting layer, or an electron injecting layer may be formed as appropriate in addition to the light-emitting layer. The organic compound-containing layer 844 can be formed by an application method such as an ink jet method or an evaporation method.

Through the above-described steps, the light-emitting element 850 in which the organic compound-containing layer 844 including at least the light-emitting layer is interposed between the pixel electrode 840 and the counter electrode 846 can be obtained.

Figure 10B:
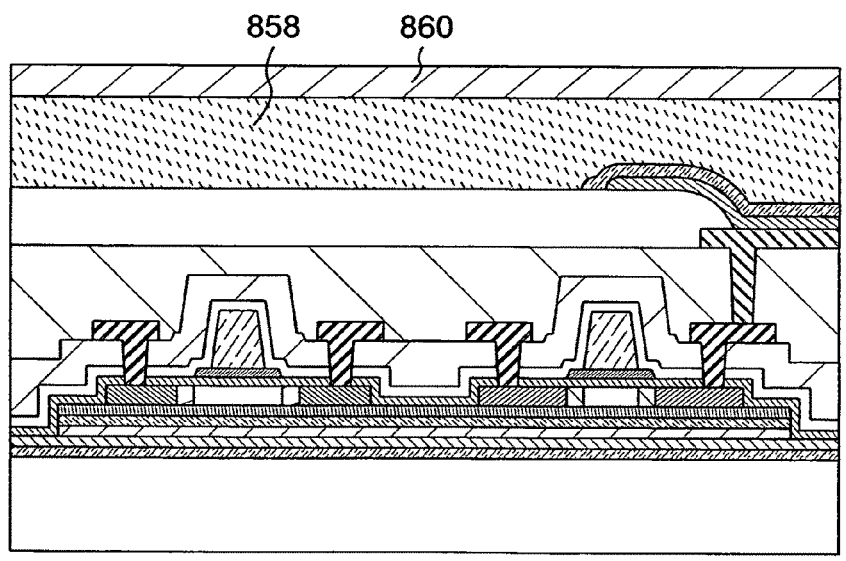

Next, a counter substrate 860 is provided so as to face the supporting substrate 120 (see FIG. 10B). A filler 858 may be provided between the counter substrate 860 and the counter electrode 846, or a space between the counter substrate 860 and the counter electrode 846 may be filled with an inert gas. Note that a protective film may also be formed so as to cover the counter electrode 846.

Note that, in order to prevent desorption of halogen which terminates dangling bonds in the semiconductor film 140, a temperature less than the temperature of the heat treatment for separating the semiconductor substrate is desirably used until the light-emitting element 850 is formed and sealed with the counter substrate 860. As described above, the temperature of the heat treatment for separating the semiconductor substrate is set as the highest temperature of the process and the processing temperatures of other steps are set to less than the temperature of the heat treatment, whereby desorption of halogen which terminates dangling bonds in the semiconductor film 140 can be prevented.

Through the above-described steps, the EL display device of this embodiment mode is completed.

As for transistors included in the display device of this embodiment mode, the semiconductor film which forms the channel formation region is terminated by halogen and improvement of the electric characteristics is achieved. In addition, the insulating film containing silicon and oxygen as its composition in which halogen is contained and the insulating film containing silicon and nitrogen as its composition each of which has a high gettering effect of metal impurities or a high blocking effect thereof is formed, and thus the display device with high reliability can be manufactured. Moreover, the channel formation region can be formed of a single-crystal semiconductor, and thus variation in transistor characteristics of each pixel can be reduced more, compared with the case of a display device using a polycrystalline semiconductor for a channel formation region. Thus, display unevenness of a light-emitting device can be suppressed.

Note that there is no particular limitation on the transistors included in the display device of this embodiment mode. For example, a transistor which have the structure described in Embodiment Mode 2 can also be employed.

Note that this embodiment mode can be combined as appropriate with other embodiment modes described in this specification.

Embodiment Mode 4

In this embodiment mode, an example of a semiconductor device to which the semiconductor device manufacturing substrate of the present invention is applied will be described.

Figure 13:
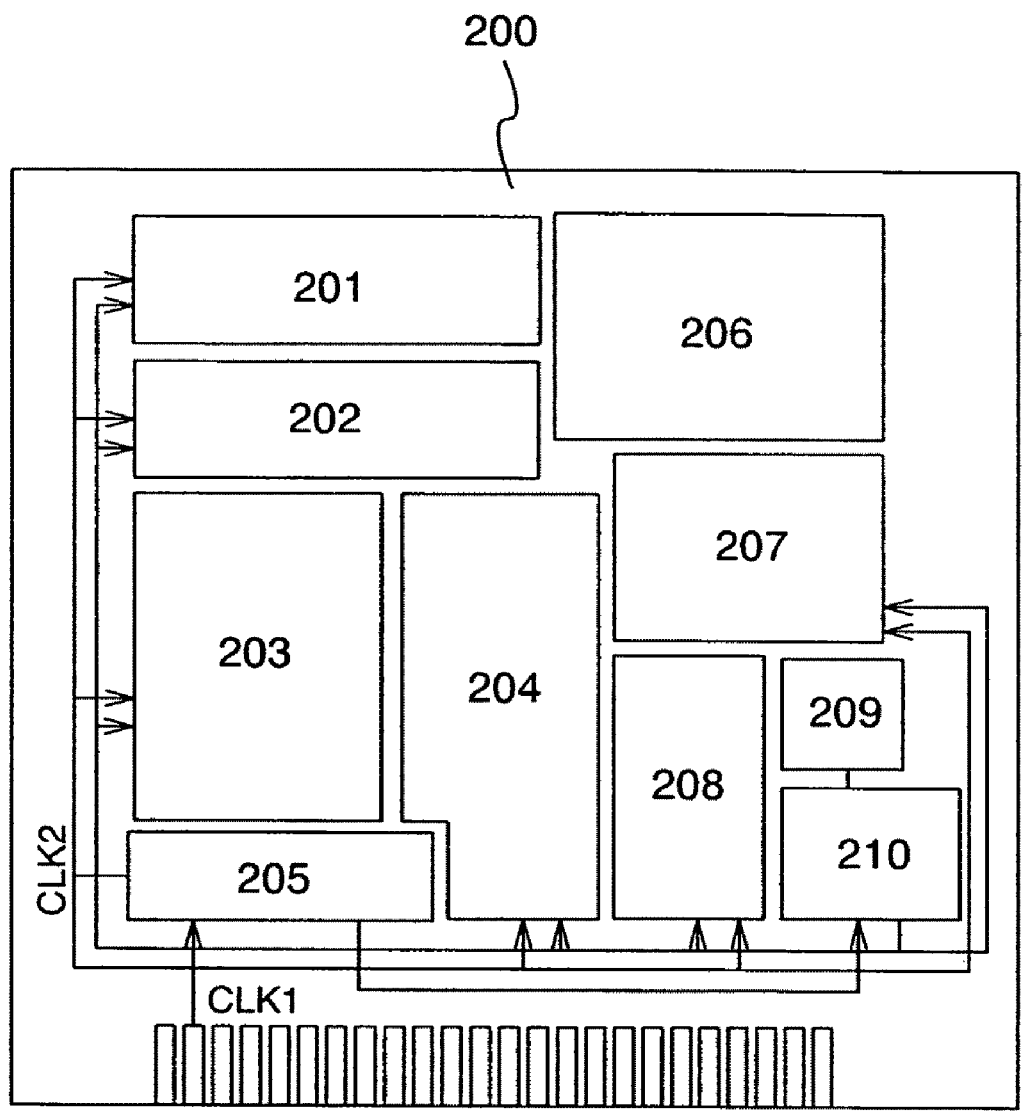
FIG. 13 is a block diagram illustrating a structure of a microprocessor obtained using a semiconductor device manufacturing substrate.

FIG. 13 shows an example of a microprocessor 200 as an example of a semiconductor device. The microprocessor 200 is manufactured by application of the semiconductor device manufacturing substrate of the above embodiment modes. This microprocessor 200 includes an arithmetic logic unit (ALU) 201, an ALU controller 202, an instruction decoder 203, an interrupt controller 204, a timing controller 205, a register 206, a register controller 207, a bus interface (Bus I/F) 208, a read-only memory 209, and a memory interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the clock signal CLK2 to the various above-described circuits. Note that the microprocessor 200 shown in FIG. 10 is only an example in which the configuration is simplified, and an actual microprocessor can have various configurations depending on the uses.

Improvement of electric characteristics of such a microprocessor 200 can be achieved by application of the semiconductor device manufacturing substrate and the semiconductor device of the above embodiment modes, and an integrated circuit which has good characteristics can be formed. In addition, an integrated circuit can be formed using a single-crystal semiconductor film, and thus higher performance, higher processing speed, and the like can be realized.

Figure 14:
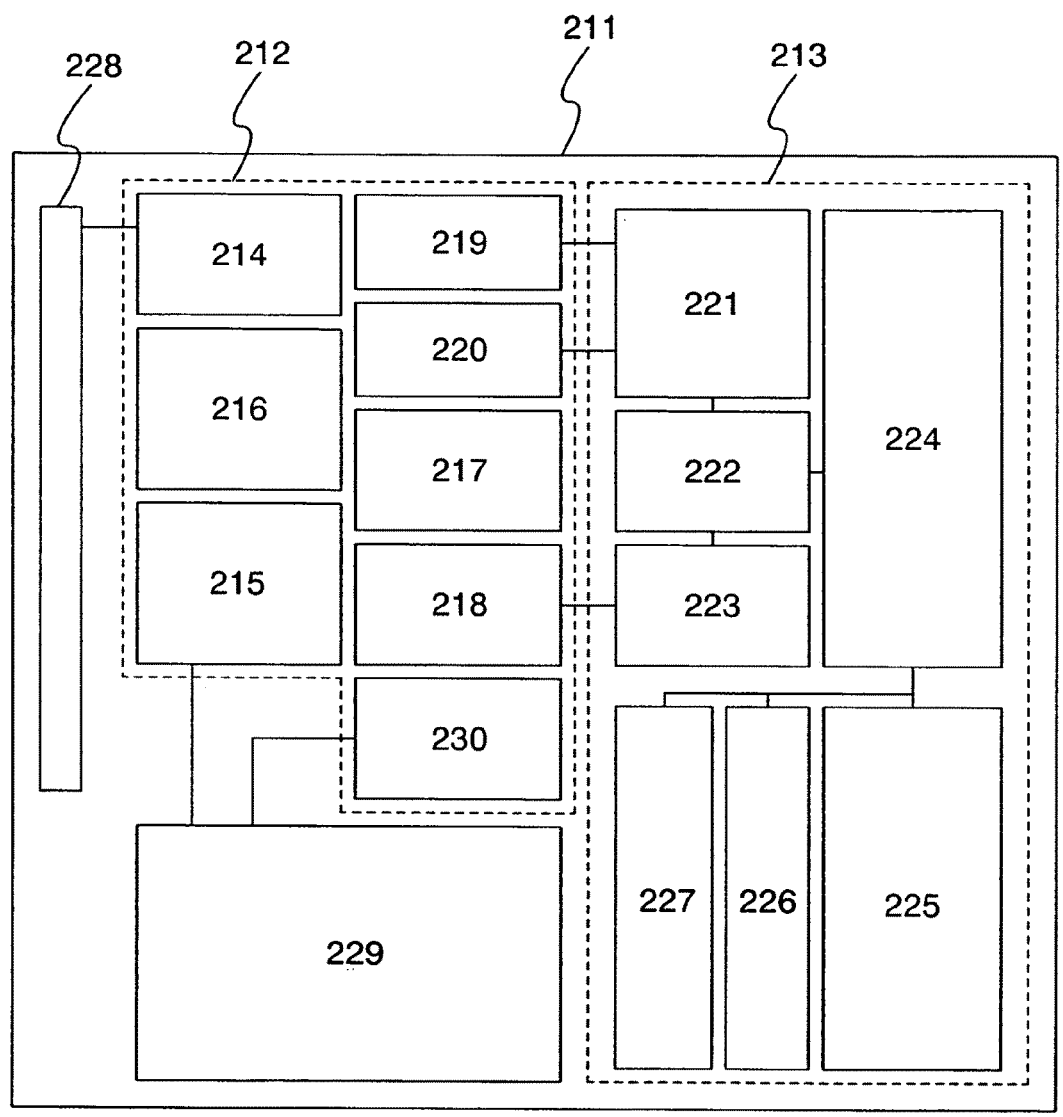
FIG. 14 is a block diagram illustrating a structure of an RFCPU obtained using a semiconductor device manufacturing substrate.

Next, an example of a semiconductor device which has an arithmetic function that is capable of contactless data transmission and reception is described with reference to FIG. 14. FIG. 14 shows an example of a computer which operates to transmit and receive signals to and from an external device by wireless communication (such a computer is hereinafter referred to as an "RFCPU"). An RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, and a modulator circuit 220. The digital circuit portion 213 has an RF interface 221, a control register 222, a clock controller 223, an interface 224, a central processing unit 225, a random-access memory 226, and a read-only memory 227.

The operation of the RFCPU 211 which has such a configuration is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable as long as the capacitor portion 229 is mounted as a different component on a substrate with an insulating surface which is included in the RFCPU 211.

The reset circuit 217 generates a signal for resetting and initializing the digital circuit portion 213. For example, the reset circuit 217 generates a signal which rises after rise in the power supply voltage with delay as a reset signal. The oscillator circuit 218 changes the frequency and duty ratio of a clock signal in response to a control signal generated by the constant voltage circuit 216. The demodulator circuit 219 formed using a low-pass filter binarizes the amplitude of, for example, a received amplitude-modulated (ASK) signal. The modulator circuit 220 varies the amplitude of an amplitude-modulated (ASK) transmission signal and transmits the signal. The modulator circuit 220 changes the amplitude of a communication signal by changing a resonance point of the resonance circuit 214. The clock controller 223 generates a control signal for changing the frequency and duty ratio of a clock signal in accordance with the power supply voltage or a consumption current of the central processing unit 225. The power supply voltage is managed by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the interface 224. The interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing can be conducted by a dedicated arithmetic circuit and the other part of the arithmetic processing can be conducted by the central processing unit 225 using a program.

Improvement of electric characteristics of such an RFCPU 211 can be achieved by application of the semiconductor device manufacturing substrate and the semiconductor device of the above embodiment modes, and an integrated circuit which has good characteristics can be formed. In addition, an integrated circuit can be formed using a single-crystal semiconductor film, and thus higher performance, higher processing speed, and the like can be realized. Note that, although FIG. 14 shows the mode of the RFCPU, a device such as an IC tag is also possible as long as it has a communication function, an arithmetic processing function, and a memory function.

Figure 15:
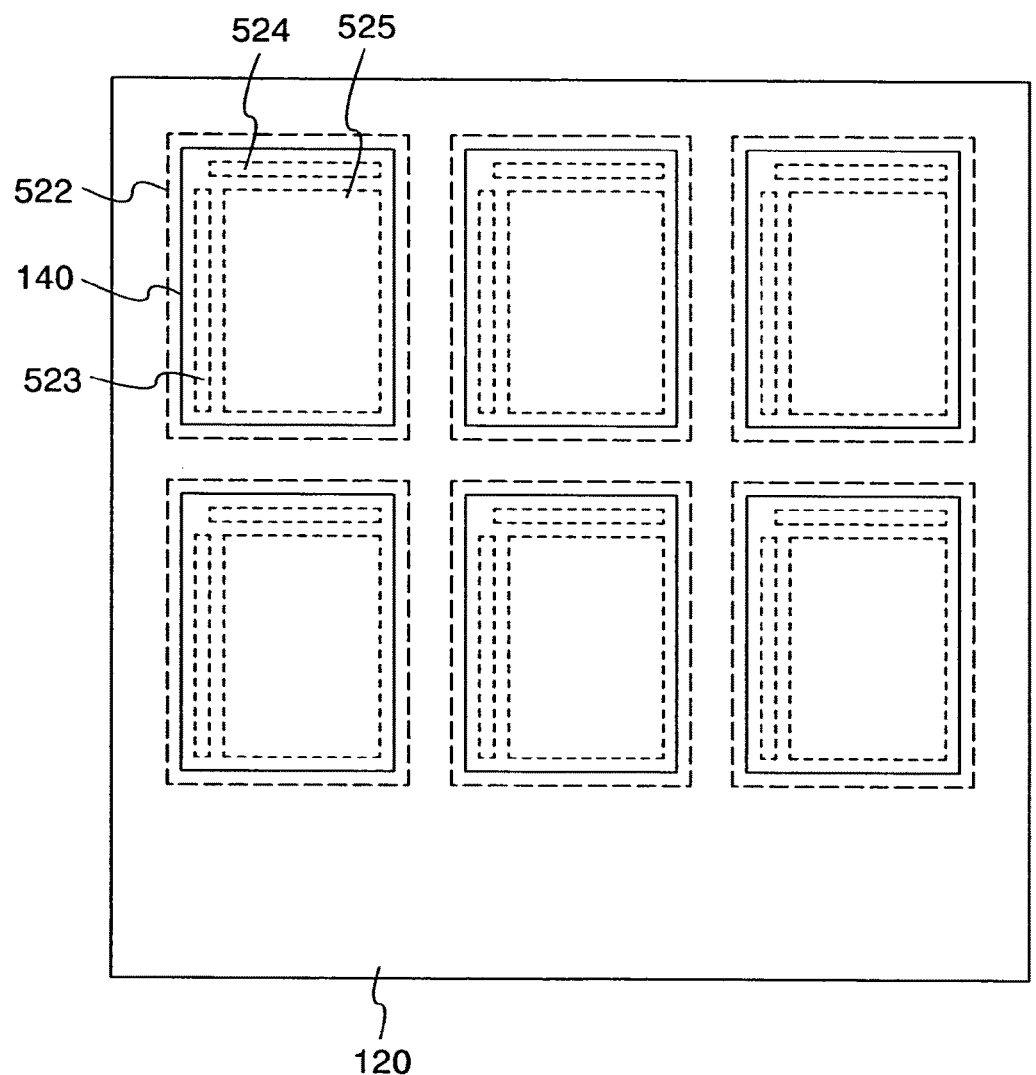
FIG. 15 is a view illustrating an example of bonding a semiconductor film to mother glass for manufacture of a display panel.

The semiconductor device manufacturing substrate of the present invention can also be formed in such a manner that a large-size glass substrate called mother glass for manufacturing a display panel is used as a supporting substrate and a semiconductor film is bonded to the large-size glass substrate. FIG. 15 shows the case where mother glass is used as a supporting substrate 120 and semiconductor films 140 are bonded to the supporting substrate 120. A plurality of display panels is cut out from the mother glass, and the semiconductor films 140 are desirably bonded to match formation regions of display panels 522. Note that the semiconductor films 140 are terminated by halogen, and halogen is desirably contained at a peak concentration of the range of $1 \times 10^{17}$ atoms/cm$^3$ to $1 \times 10^{21}$ atoms/cm$^3$. Since the mother glass has a larger area than a semiconductor substrate, it is desirable that a plurality of semiconductor films 140 be arranged within the formation regions of the display panels 522, as shown in FIG. 15. This makes it possible to increase the number of panels to be taken from the mother glass, and thus productivity is dramatically increased. Each of the display panels 522 includes a scan line driver circuit region 523, a signal line driver circuit region 524, and a pixel formation region 525. Each of the semiconductor films 140 is bonded to the supporting substrate 120 so that these regions are included in each of the display panels 522.

Note that a large-size glass substrate called mother glass contains metal impurities such as sodium, which is a problem. However, as for the semiconductor device manufacturing substrate of the present invention, an insulating film containing silicon and nitrogen as its composition and an insulating film containing silicon and oxygen as its composition in which halogen is contained each of which has a high blocking effect and a high gettering effect is formed between the glass substrate and the semiconductor film. Thus, deterioration of characteristics of the display panel or the like can be prevented, and increase in reliability can be achieved.

Figure 16A:
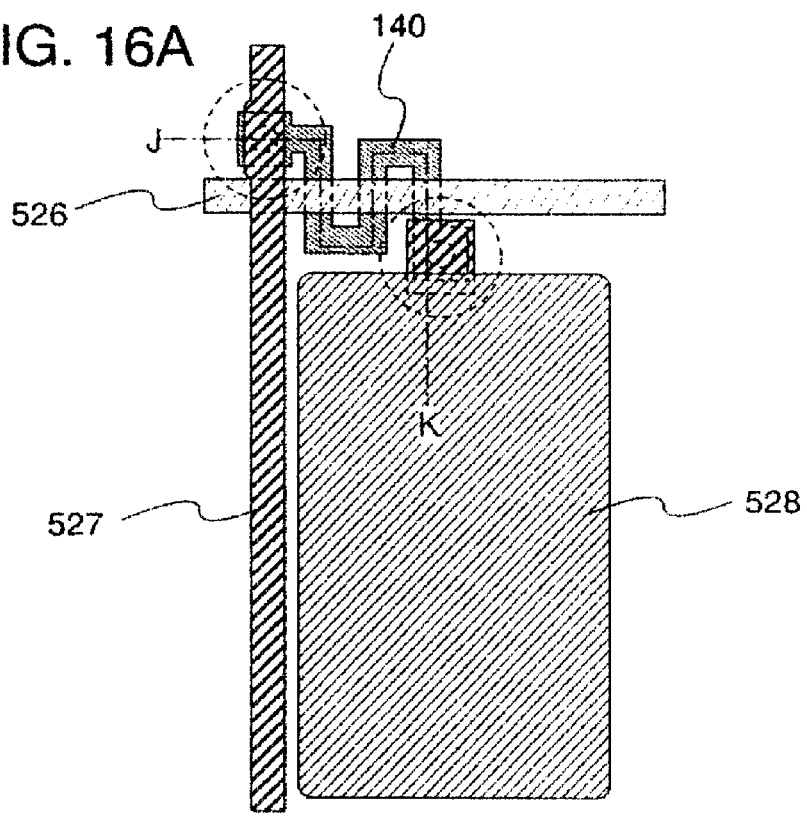
FIGS. 16A and 16B are views illustrating an example of a liquid crystal display device.
Figure 16B:
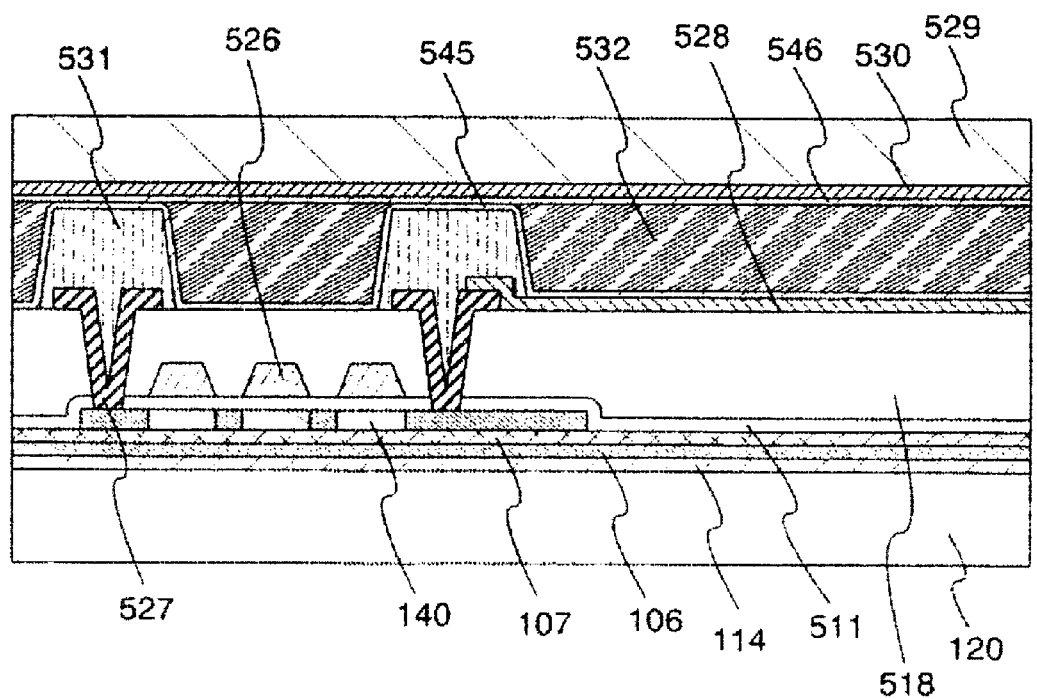

FIGS. 16A and 16B show an example of a pixel of a liquid crystal display device to which a semiconductor device manufacturing substrate of the present invention is applied and in which a transistor for a pixel portion is formed using a semiconductor film of the semiconductor device manufacturing substrate. FIG. 16A is a plane view of a pixel in which a scan line 526 intersects with the semiconductor film, and a signal line 527 and a pixel electrode 528 are connected to each other. FIG. 16B is a cross-sectional view taken along the chained line J-K in FIG. 16A.

In FIG. 16B, there is a region which has a structure in which the semiconductor film 140 is stacked over the supporting substrate 120 with the bonding layer 114, the insulating film 106 containing silicon and nitrogen as its composition, and the third insulating film 107 containing silicon and oxygen as its composition which are stacked in order over the supporting substrate 120 interposed therebetween, and a pixel transistor of this embodiment mode is formed to include the above-describe region. In this embodiment mode, the semiconductor film 140 is a single-crystal semiconductor film. In addition, the semiconductor film 140 is terminated by halogen, and halogen is desirably contained at a peak concentration of the range of $1 \times 10^{17}$ atoms/cm$^3$ to $1 \times 10^{21}$ atoms/cm$^3$.

The pixel electrode 528 is provided over an interlayer insulating film 518. A contact hole for connecting the semiconductor film 140 and the signal line 527 is formed in the interlayer insulating film 518. A columnar spacer 531 is provided over the signal line 527 so as to fill a step due to the contact hole formed in the interlayer insulating film 518. A counter substrate 529 is provided with a counter electrode 530. A liquid crystal 532 held by an orientation film 545 and an orientation film 546 is provided in a space formed by the columnar spacer 531. Note that, although not shown here, a polarization plate is provided outside the supporting substrate 120 or the counter substrate 529, if necessary.

The interlayer insulating film 518 can be formed as a single-layer film or a stacked-layer film. Note that a planarization film which can smooth unevenness due to a structural body such as a transistor formed under the interlayer insulating film 518 and can form an even surface is desirably formed as the interlayer insulating film 518. For example, the interlayer insulating film 518 can be formed using an organic material such as polyimide, polyamide, polyvinyl phenol, benzocyclobutene, acrylic, or epoxy; a siloxane material such as a siloxane resin; an oxazole resin; or the like by an application method such as a spin coating method. Alternatively, a BPSG film may be formed as the interlayer insulating film 518. Further alternatively, an insulating film such as a silicon oxide film, a silicon nitride film, a silicon oxynitride film, or a silicon nitride oxide film can be formed by a CVD method or a sputtering method. Still alternatively, an insulating film formed using an organic material and an insulating film formed using an inorganic material may be stacked.

In the case of a reflective liquid crystal display device, a reflective electrode may be formed as the pixel electrode 528. Specifically, the pixel electrode 528 can be formed using a reflective conductive material, for example, a metal element such as tantalum, tungsten, titanium, molybdenum, aluminum, chromium, or silver, or an alloy material or a compound material containing the metal element. Note that, in the case where a reflective film is formed separately from the pixel electrode 528, or in the case of a transmissive liquid crystal display device, the pixel electrode 528 may be formed as a light-transmitting electrode and formed using a light-transmitting conductive material. As a light-transmitting conductive material, indium tin oxide (ITO), zinc oxide (ZnO), indium zinc oxide (IZO), zinc oxide doped with gallium (GZO), or the like can be used.

The pixel electrode 528 can be formed using a conductive composition containing a conductive high molecule (also referred to as a conductive polymer). A thin film of the pixel electrode formed using a conductive composition desirably has a sheet resistance of less than or equal to 10000 Ω/square and a light transmittance of less than or equal to 70% at a wavelength of 550 nm. In addition, the resistance of the conductive high molecule which is contained in the conductive composition is desirably less than or equal to 0.1 Ω·cm. Note that a conductive high molecule is described in detail according to the conductive high molecule which can be used for the pixel electrode 840 or the counter electrode 846 in Embodiment Mode 3.

The columnar spacer 531 can be obtained in such a manner that an insulating film is formed over the entire surface of the substrate, using an organic material such as epoxy, polyimide, polyamide, polyimide amide, or acrylic, or an insulating material such as silicon oxide, silicon nitride, silicon oxynitride, or silicon nitride oxide and then the insulating film is etched into a desired shape.

A material for the orientation film 545 and the orientation film 546 may be selected in accordance with an operation mode of a liquid crystal which is to be used, and a film which can align liquid crystals in a certain direction is formed. For example, a film is formed using a material such as polyimide or polyamide and orientation treatment is performed on the film, whereby the film can function as an orientation film. Rubbing, irradiation with ultraviolet rays or the like, or the like may be performed for the orientation treatment. Although there is no particular limitation on a formation method of the orientation film 545 and the orientation film 546, various printing methods or a droplet discharge method enables selective formation of the orientation film 545 and the orientation film 546.

The liquid crystal 532 is formed using a desired liquid crystal material. For example, the liquid crystal 532 can be formed in such a manner that a liquid crystal material is dropped within a frame-shaped seal pattern formed of a sealant. A liquid crystal material may be dropped by a dispenser method or a droplet discharge method. Note that it is desirable that a liquid crystal material be deaerated under reduced pressure in advance, or be deaerated under reduced pressure after a liquid crystal is dropped. Note that a liquid crystal material is desirably dropped under an inert gas atmosphere so that impurities or the like are not mixed. It is desirable that steps after the liquid crystal 532 is formed by dropping of a liquid crystal material until the supporting substrate 120 and the counter substrate 529 are bonded to each other be performed under reduced pressure so that air bubbles or the like are not formed in the liquid crystal 532. Alternatively, the liquid crystal 532 can be formed in such a manner that after the supporting substrate 120 and the counter substrate 529 are bonded to each other, a liquid crystal material is injected within a frame-shaped pattern formed of a sealant, by utilization of a capillary phenomenon. In that case, a portion which is to serve as an inlet of a liquid crystal is formed in the sealant or the like in advance. Note that a liquid crystal material is desirably injected under reduced pressure.

As the counter substrate 529, for example, various glass substrates such as an aluminosilicate glass substrate, an aluminoborosilicate glass substrate, or a barium borosilicate glass substrate; a quartz substrate; a ceramic substrate; a sapphire substrate; or the like can be used. Note that, in the case of a reflective liquid crystal display device, a light-transmitting substrate (specifically, a glass substrate, a quartz substrate, or the like) is used as the counter substrate 529. In addition, in the case of a transmissive liquid crystal display device, a non-transmissive substrate (e.g., a ceramic substrate or a sapphire substrate) as well as a light-transmitting substrate can be used. Note that the counter electrode 530 and the orientation film 546 may be formed over the counter substrate 529 before the counter substrate 529 is bonded to the supporting substrate 120. Alternatively, the counter substrate 529 may be provided with a color filter, a black matrix, or the like.

Figure 17A:
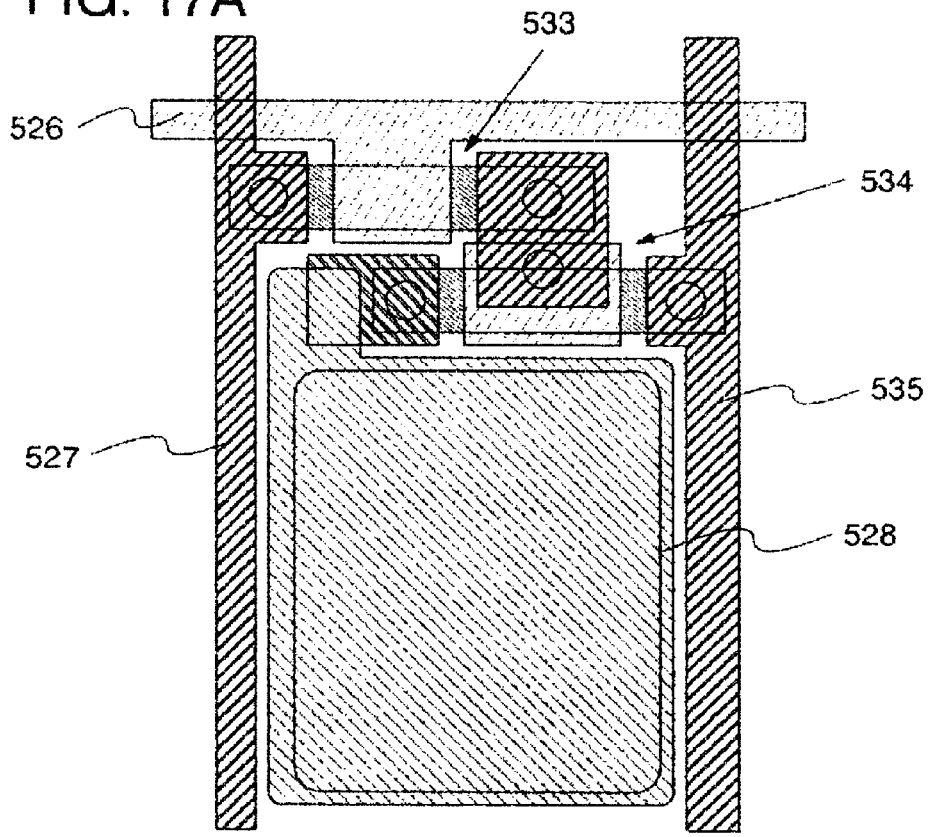
FIGS. 17A and 17B are views illustrating an example of an electroluminescence display device.
Figure 17B:
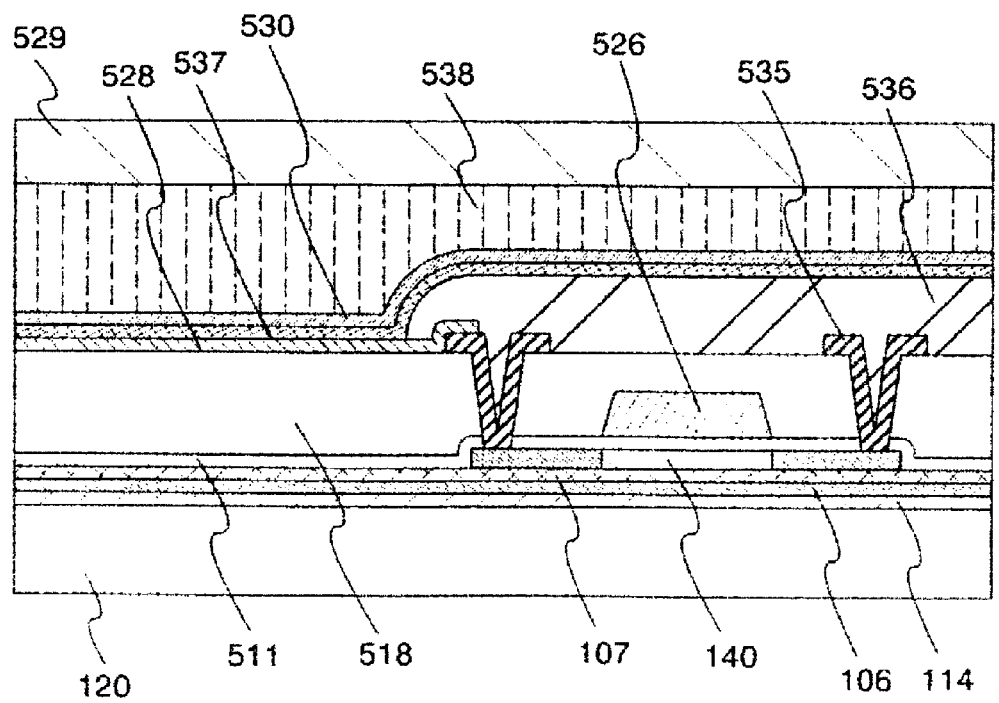

FIG. 17A shows an example of an EL display device to which a semiconductor device manufacturing substrate of the present invention is applied and in which a transistor for a pixel portion is formed using a semiconductor film of the semiconductor device manufacturing substrate. Note that a structure of the transistor of the EL display device differs from that of the display device described in Embodiment Mode 3. FIG. 17A is a plane view of a pixel which includes a selection transistor 533 connected to a signal line 527 and a display control transistor 534 connected to a current supply line 535. This display device has a structure in which a light-emitting element including an organic compound-containing layer as a light-emitting layer is provided for each pixel. A pixel electrode 528 is connected to the display control transistor 534. FIG. 17B is a cross-sectional view showing a main part of such a pixel.

In FIG. 17B, there is a region which has a structure in which the semiconductor film 140 is stacked over the supporting substrate 120 with the bonding layer 114, the insulating film 106 containing silicon and nitrogen as its composition, and the third insulating film 107 containing silicon and oxygen as its composition which are stacked in order over the supporting substrate 120 interposed therebetween, and the display control transistor 534 is formed to include such a region. In this embodiment mode, the semiconductor film 140 is a single-crystal semiconductor film. In addition, the semiconductor film 140 is terminated by halogen, and halogen is desirably contained at a peak concentration of the range of $1\times10^{17}$ atoms/cm$^3$ to $1\times10^{21}$ atoms/cm$^3$. Structures of the bonding layer 114, the insulating film 106 containing silicon and nitrogen as its composition, the third insulating film 107 containing silicon and oxygen as its composition, the semiconductor film 140, the interlayer insulating film 518, and the like are the same as those in FIG. 16B. A peripheral portion of the pixel electrode 528 is surrounded by an insulating partition film 536. An organic compound-containing layer 537 including at least a light-emitting layer is formed over the pixel electrode 528. A counter electrode 530 is formed over the organic compound-containing layer 537. The pixel portion is filled with a sealing resin 538, and the counter substrate 529 is provided as a reinforcing plate.

A display screen of the EL display device of this embodiment mode is formed in such a manner that such pixels are arranged in matrix. In this case, when a channel portion of the transistor of the pixel is formed using the semiconductor film 140 which is a single-crystal semiconductor, there are advantages in that characteristics do not vary among transistors and unevenness is not generated in emission luminance of each pixel. Thus, driving while controlling luminance of a light-emitting element with current becomes easy, and a correction circuit which corrects variations in characteristics of a transistor is not needed, and thus load on a driver circuit can be reduced. Furthermore, a light-transmitting substrate can be selected as the supporting substrate 120, and thus a bottom emission type EL display device which emits light from the supporting substrate 120 side can be formed.

As described above, a single-crystal semiconductor film is also formed over mother glass used for manufacturing a liquid crystal display device or an EL display device, and a transistor can be formed using the single-crystal semiconductor film. A transistor formed using a single-crystal semiconductor film is superior to an amorphous silicon transistor in all operating characteristics such as current drive capacity, and thus the size of the transistor can be reduced. Accordingly, an aperture ratio of a pixel portion in a display panel can be increased. In addition, a structure is employed in which a film which has a high blocking effect is provided between mother glass and a single-crystal semiconductor film, and thus a display device with high reliability can be provided. Note that a microprocessor as described with reference to FIG. 13 and FIG. 14 can also be formed, and thus a display device can be equipped with a function of a computer. Moreover, a display which is capable of input and output of data without contact can also be manufactured.

A variety of electronic devices can be formed using the semiconductor device manufacturing substrate of the present invention. As examples of electronic devices, there are a camera such as a video camera or a digital camera, a navigation system, a sound reproducing device (a car audio, an audio component, or the like), a computer, a game machine, a portable information terminal (a mobile computer, a cellular phone, a mobile game machine, an electronic book, or the like), an image reproducing device having a recording medium (specifically, a device for reproducing a recording medium such as a digital versatile disc (DVD) and having a display for displaying the reproduced image), and the like.

Figure 18A:
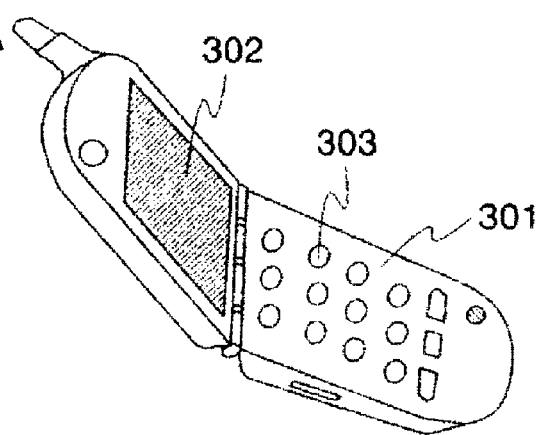
FIGS. 18A to 18C are diagrams each illustrating an example of an electronic device.

FIG. 18A shows an example of a cellular phone. A cellular phone 301 described in this embodiment mode includes a display portion 302, operation switches 303, and the like. In the display portion 302, the liquid crystal display device described with reference to FIGS. 16A and 16B or the EL display device described with reference to FIGS. 10A and 10B or FIGS. 17A and 17B can be used. With use of the display device of this embodiment mode, a display portion with high image quality can be formed. In addition, the semiconductor device of the present invention can be also applied to a microprocessor or a memory which is included in the cellular phone 301.

Figure 18B:
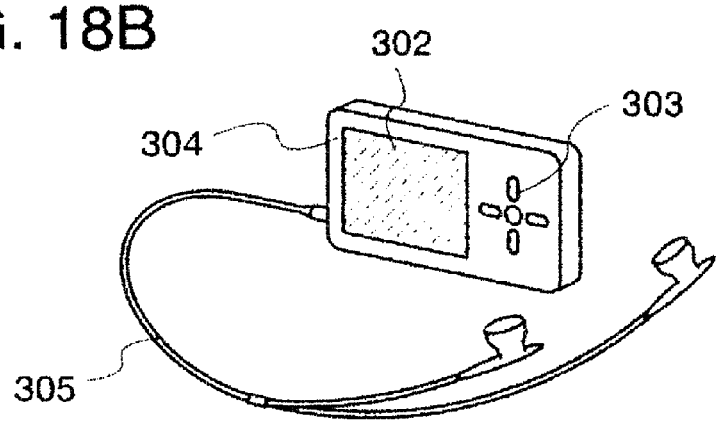

FIG. 18B shows a digital player 304, which is one of typical examples of an audio device. The digital player 304 shown in FIG. 18B includes a display portion 302, operation switches 303, earphones 305, and the like. Instead of the earphones 305, headphones or wireless earphones can be used. In the digital player 304, the semiconductor device of the present invention can be applied to a memory portion which stores music information or a microprocessor which operates the digital player 304. The digital player 304 having this structure can achieve reduction in size and weight. By application of the liquid crystal display device described with reference to FIGS. 16A and 16B or the EL display device described with reference to FIGS. 10A and 10B or FIGS. 17A and 17B to the display portion 302, the display portion 302 can display an image or textual information with high definition even if it has a screen size of about 0.3 inches to 2 inches.

Figure 18C:
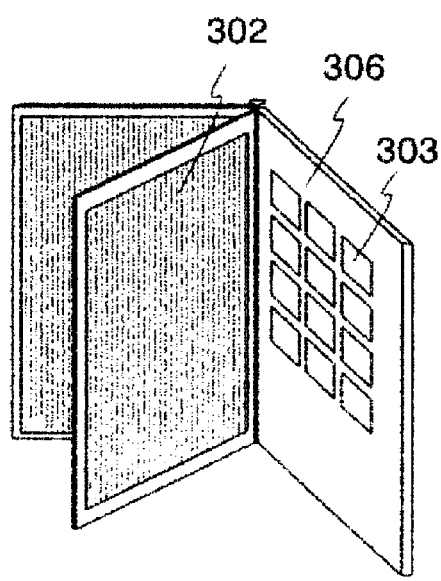

FIG. 18C shows an electronic book 306. This electronic book 306 includes a display portion 302 and operation switches 303. A modem may be built in, or a structure in which information can be transmitted and received wirelessly may be employed. In the electronic book 306, the semiconductor device of the present invention can be used for a memory portion which stores information or a microprocessor which operates the electronic book 306. In the memory portion, a NOR-type nonvolatile memory with a memory capacity of greater than or equal to 20 gigabytes (GB) and less than or equal to 200 gigabytes (GB) can be used, with which images or sounds (music) can be stored and reproduced. By application of the liquid crystal display device described with reference to FIGS. 16A and 16B or the EL display device described with reference to FIGS. 10A and 10B or FIGS. 17A and 17B to the display portion 302, the display portion 302 can perform display with high image quality.

Note that this embodiment mode can be combined as appropriate with other embodiment modes described in this specification.

This application is based on Japanese Patent Application serial no. 2007-162106 filed with Japan Patent Office on Jun. 20, 2007, the entire contents of which are hereby incorporated by reference.

What is claimed is:

1. A method for manufacturing a semiconductor substrate comprising the steps of:
    forming a first insulating film containing silicon and oxygen as its composition over a single-crystal semiconductor substrate;
    forming a second insulating film containing silicon and nitrogen as its composition over the first insulating film;
    irradiating the second insulating film with first ions to form a separation layer in the single-crystal semiconductor substrate;
    irradiating the second insulating film with second ions so that halogen is contained in the first insulating film, wherein the second ions are halogen ions;
    forming a bonding layer over the second insulating film;
    bonding the single-crystal semiconductor substrate and a supporting substrate with the bonding layer interposed therebetween; and
    performing heat treatment to separate the single-crystal semiconductor substrate with a single-crystal semiconductor film left over the supporting substrate, and accordingly the halogen is contained in the single-crystal semiconductor film.

2. The method for manufacturing a semiconductor substrate according to claim 1, wherein the first insulating film containing silicon and oxygen as its composition is a thermal oxide film.

3. The method for manufacturing a semiconductor substrate according to claim 1, wherein the first insulating film containing silicon and oxygen as its composition is a silicon oxide film or a silicon oxynitride film.

4. The method for manufacturing a semiconductor substrate according to claim 1, wherein the second insulating film containing silicon and nitrogen as its composition is a silicon nitride film or a silicon nitride oxide film.

5. The method for manufacturing a semiconductor substrate according to claim 1, wherein the halogen is fluorine or chlorine.

6. The method for manufacturing a semiconductor substrate according to claim 1, wherein the bonding layer is a silicon oxide film or a film having siloxane bonds.

7. The method for manufacturing a semiconductor substrate according to claim 1, wherein the bonding layer is a silicon oxide film, and wherein the silicon oxide film is formed by a chemical vapor deposition method, using organic silane or inorganic silane as a source gas.

8. The method for manufacturing a semiconductor substrate according to claim 1, wherein the supporting substrate is one selected from the group consisting of a glass substrate, a quartz substrate, a ceramic substrate, a sapphire substrate, and a metal substrate whose surface is coated with an insulating film.

9. The method for manufacturing a semiconductor substrate according to claim 1, wherein a second bonding layer and a barrier film are provided over the supporting substrate.

10. A method for manufacturing a semiconductor substrate comprising the steps of:
    forming a first insulating film containing silicon and oxygen as its composition over a single-crystal semiconductor substrate;
    forming a second insulating film containing silicon and nitrogen as its composition over the first insulating film;
    irradiating the second insulating film with first ions to form a separation layer in the single-crystal semiconductor substrate;
    irradiating the second insulating film with second ions so that halogen is contained in the first insulating film, wherein the second ions are halogen ions;
    forming a bonding layer over the second insulating film;
    bonding the single-crystal semiconductor substrate and a supporting substrate with the bonding layer interposed therebetween; and
    performing heat treatment to separate the single-crystal semiconductor substrate with a single-crystal semiconductor film left over the supporting substrate, and accordingly the halogen is contained in the single-crystal semiconductor film,
    wherein the heat treatment is performed at a temperature of greater than or equal to 550° C. and less than or equal to the strain point of the supporting substrate.

11. The method for manufacturing a semiconductor substrate according to claim 10, wherein the first insulating film containing silicon and oxygen as its composition is a thermal oxide film.

12. The method for manufacturing a semiconductor substrate according to claim 10, wherein the first insulating film containing silicon and oxygen as its composition is a silicon oxide film or a silicon oxynitride film.

13. The method for manufacturing a semiconductor substrate according to claim 10, wherein the second insulating film containing silicon and nitrogen as its composition is a silicon nitride film or a silicon nitride oxide film.

14. The method for manufacturing a semiconductor substrate according to claim 10, wherein the halogen is fluorine or chlorine.

15. The method for manufacturing a semiconductor substrate according to claim 10, wherein the bonding layer is a silicon oxide film or a film having siloxane bonds.

16. The method for manufacturing a semiconductor substrate according to claim 10, wherein the bonding layer is a silicon oxide film, and wherein the silicon oxide film is formed by a chemical vapor deposition method, using organic silane or inorganic silane as a source gas.

17. The method for manufacturing a semiconductor substrate according to claim 10, wherein the supporting substrate is one selected from the group consisting of a glass substrate, a quartz substrate, a ceramic substrate, a sapphire substrate, and a metal substrate whose surface is coated with an insulating film.

18. The method for manufacturing a semiconductor substrate according to claim 10, wherein a second bonding layer and a barrier film are provided over the supporting substrate.

* * * * *